US011174277B2

(12) United States Patent
Zhu et al.

(10) Patent No.: US 11,174,277 B2
(45) Date of Patent: Nov. 16, 2021

(54) SEQUESTERING COMPOSITIONS AND MATERIALS

(71) Applicants: Alliance for Sustainable Energy, LLC, Golden, CO (US); Board of Trustees of Northern Illinois University, DeKalb, IL (US)

(72) Inventors: Kai Zhu, Littleton, CO (US); Tao Xu, Naperville, IL (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 16/736,958

(22) Filed: Jan. 8, 2020

(65) Prior Publication Data
US 2020/0377533 A1    Dec. 3, 2020

Related U.S. Application Data

(60) Provisional application No. 62/853,951, filed on May 29, 2019.

(51) Int. Cl.
| C07F 9/40 | (2006.01) |
| C07F 9/38 | (2006.01) |
| H01L 31/042 | (2014.01) |
| C08L 71/02 | (2006.01) |
| H02S 40/38 | (2014.01) |

(52) U.S. Cl.
CPC .......... *C07F 9/4006* (2013.01); *C07F 9/3873* (2013.01); *C08L 71/02* (2013.01); *H01L 31/042* (2013.01); *H02S 40/38* (2014.12)

(58) Field of Classification Search
CPC ............................ C07F 9/4006; C07F 9/3839
USPC ........................................................ 558/156
See application file for complete search history.

(56) References Cited

U.S. PATENT DOCUMENTS

| 2002/0100732 A1 | 8/2002 | Atwood et al. |
| 2011/0160150 A1 | 6/2011 | Haley et al. |
| 2013/0306521 A1 | 11/2013 | O'Rear et al. |
| 2016/0152563 A1 | 6/2016 | Calmes, Jr. et al. |

OTHER PUBLICATIONS

Puljula, E., P. Turhanen, J. Vepsalainen, M. Monteil, M. Lecouvey and J. Weisell, "Structural Requirements for Bisphosphonate Binding on Hydroxyapatite: NMR study of Bisphosphonate partial esters", ACS Med. Chem. Lett. (2015), 6: pp. 397-401. (Year: 2015).*
Zhang, Q., F. Hao, J. Li, Y. Zhou, Y. Wei and H. Lin, "Perovskite solar cells: must lead be replaced- and can it be done?", Sci. Technol. Adv. Mater., 19 (1), (2018), pp. 425-442. (Year: 2018).*
Horwitz, E., R. Chiarizia and Mark Dietz, "DIPEX: A new extraction chromatographic material for the separation and preconcentration of actinides from aqueous solution", Reactive & Functional Polymers, 33 (1), (1997), pp. 25-36. (Year: 1997).*
Daniels, Y., N. Lyczko, A. Nzihou and S. Alexandratos, "Modification of Hydroxyapatite with ion-selective complexants: 1-Hydroxyethane-1,1-diphosphonic acid", Ind. Eng. Chem. Res., 2015, 54, pp. 585-596. (Year: 2015).*
Hoefler, S., G. Trimmel and T. Rath, "Progress on lead-free metal halide perovskites for photovoltaic applications: review" Monatsh Chem. (2017), 148: pp. 795-826. (Year: 2017).*
International Search Report and Written Opinion from corresponding PCT/US20/12712, dated Apr. 2, 2020, 7 pages.
Babayigit, A. et al., "Assessing the toxicity of Pb- and Sn-based perovskite solar cells in model organism Danio rerio," Scientific Reports, Jan. 2016; DOI:10.1038/srep18721, 11 pages.
Babayigit, A. et al., "Toxicity of organometal halide perovskite solar cells," Nature Materials, vol. 15, Mar. 2016, 5 pages.
Babaygit, A. et al., "Environment versus sustainable energy: The case o f lead halide perovskite-based solar cells," MRS Energy & Sustainability: A Review Journal; 2018; DOI:10.1557/mre.2017.17, 15 pages.
Bae, S.Y. et al., "Hazard potential of perovskite solar cell technology for potential implementation of "safe-by-design" approach," Scientific Reports, vol. 9, 2019, 9 pages.
Becke, A., "Density-functional thermochemistry. III. The Role of exact exchange.", J. Chem. Phys., vol. 98, No. 7, Apr. 1993, 5 pages.
Binek, A. et al., "Recycling Perovskite Solar Cells to Avoid Lead Waste," ACS Applied Materials & Interfaces, vol. 8, 2016, 6 pages.
Chen, M. et al., "Highly stable and efficient all-inorganic lead-free perovskite solar cells with native-oxide passivation," Nature Communications, DOI.org/10.1038/s41467-018-07951-y, 8 pages.
Chen, R. et al., "High-Efficiency, Hysteresis-Less, UV-Stable Perovskite Solar Cells with Cascade ZnO—ZnS Electron Transport Layer," J. of the American Chemical Society, vol. 141, 2019, pp. 541-547.
Conings, B. et al., "Fire Safety of Lead Halide Perovskite Photovoltaics," ACS Energy Letters, vol. 4, 2019, pp. 873-878.
Fabini, D. et al., "Quantifying the Potential for Lead Pollution from Halide Perovskite Photovoltaics," J. of Physical Chem. Letters, vol. 6, 2015, pp. 3546-3548.
Giddings, J.C. et al., "Resolution and Peak Capacity in Equilibrium-Gradient Methods of Separation," Separation Science, vol. 6, No. 3, Jun. 1971, pp. 345-356.
Grimme, S., "Semiempirical GGA-Type Density Functional Constructed with a Long-Range Dispersion Correction," Wiley, InterScience, DOI 10.1002/jcc.20495, 13 pages.

(Continued)

*Primary Examiner* — Joseph R Kosack
*Assistant Examiner* — Sagar Patel
(74) *Attorney, Agent, or Firm* — Michael A. McIntyre

(57) ABSTRACT

The present disclosure relates to a composition that includes a sequestering material capable of binding a target material, where the sequestering material includes a first component that includes at least one of a functional group, a molecule, an oligomer, or a polymer, and the target material includes at least one of an element, a chemical, and/or a compound. In some embodiments of the present disclosure, the element may include at least one element from at least one of Rows 4, 5, 6, and 7 of the Periodic Table and/or an inner transition metal.

12 Claims, 31 Drawing Sheets

(56) References Cited

OTHER PUBLICATIONS

Hailegnaw, B. et al., "Rain on Methylammonium Lead Iodide Based Perovskites: Possible Environmental Effects of Perovskite Solar Cells," J. of Physical Chem. Letters, vol. 6, 2015, pp. 1543-1547.
Hsiao, M.C. et al., "Bidentate chelating ligands as effective passivating materials for perovskite light-emitting diodes," RSC Phys. Chem. Chem. Phys., vol. 21, 2019, pp. 7867-7873.
Huang, F. et al., "From scalable solution fabrication of perovskite films towards commercialization of solar cells," Energy & Environmental Science, 2018, DOI:10.1039/c8ee03025a, 32 pages.
Jena, A. et al., "Role of spiro-OMeTAD in performance deterioration of perovskite solar cells at high temperature and reuse of the perovskite films to avoid Pb-waste," J. of Materials Chemistry A, vol. 6, 2018, pp. 2219-2230.
Jiang, Y. et al., "Reduction of lead leakage from damaged lead halide perovskite solar modules using self-healing polymer-cased encapsulation," Nature Energy, vol. 4, Jul. 2019, pp. 585-593.
Jokar, E. et al., "RobustTin-Based Perovskite Solar Cells with Hybrid Organic Cations to Attain Efficiency Approaching 10%," Advanced Materials Communication, vol. 31, 2019, 7 pages.
Jung, E. et al., "Efficient, stable and scalable perovskite solar cells using poly (3-hexylthiophene)," Letter, vol. 567, Mar. 28, 2019, 19 pages.
Ke, W. et al., "Unleaded Perovskites: Status Quo and Future Prospects of Tin-Based Perovskite Solar Cells," Advanced Materials Review, vol. 31, 2019, 31 pages.
Lee, C. et al., "Development of the Colle-Salvetti correlation-energy formula into a functional of the electron density," Physical Review B, The American Physical Society, vol. 37, No. 2, Jan. 1988, 5 pages.
Leyden, M. et al., "Methylammonium Lead Bromide Perovskite Light-Emitting Diodes by Chemical Vapor Deposition," J. Phys. Chem. Lett., vol. 8, 2017, pp. 3193-3198.
Lyu, M. et al., "Addressing Toxicity of Lead: Progress and Applications of Low-Toxic Metal Halide Perovskites and Their Derivatives," Adv. Energy Materials, vol. 7, 2017, 26 pages.
Qiu, L. et al., "Advances and challenges to the commercialization of organic-inorganic halide perovskite solar cell technology," Materials Today Energy, vol. 7, 2018, 21 pages.
Sato, H. et al., "Ionic Diffusion Coefficients of $Cs+$, $PB2+$, $Sm3+$, $Ni2+$, $SeO2-4$ and $TcO-4$ in Free Water Determined from Conductivity Measurements, Journal of Nuclear Science and Technology, vol. 33, No. 12, 2012, 7 pages.
Serrano-Lujan, L. et al., "Tin- and Lead-Based Perovskite Solar Cells under Scrutiny: An Environmental Perspective," vol. 5, 2015, 5 pages.
Stoumpos, C. et al., "Semiconducting Tin and Lead Iodide Perovskites with Organic Cations: Phase Transitions, High Mobilities, and Near-Infrared Photoluminescent Properties," Inorganic Chemistry, vol. 52, 2013, pp. 9019-9038.
Tomasi, J. et al., "Quantum Mechanical Continuum Solvation Models," Chem. Re. 2005, vol. 105, pp. 2999-3093.
Wu, S. et al., "A chemically inert bismuth interlayer enhances long-term stability of inverted perovskite solar cells," Nature Communications, DOI.org/10.1038/s41467-019-09167-0, 11 pages.
Yang, J. et al., "High-Performance Perovskite Solar Cells with Excellent Humidity and Thermo-Stability via Fluorinatec Perylenediimide," Advanced Energy Materials, vol. 9, 2019, 9 pages.
Yoo, Y. et al., "Evaluating the environmental impact of the lead species in perovskite solar cells via environmental-fate modeling," Journal of Industrial and Engineering Chemistry, vol. 70, 2019, 9 pages.
Zhang, F. et al., "Self-Seeding Growth for Perovskite Solar Cells with Enhanced Stability," Joule 3, 2019, pp. 1452-1463.
Zhang, Q. et al., "Perovskite solar cells: must lead be replaced- and can it be done?", Science and Tech. of Advanced Materials, vol. 19, No. 1, 2018, pp. 425-442.

* cited by examiner

SEQUESTERING COMPOSITIONS AND MATERIALS

CROSS-REFERENCE TO RELATED APPLICATIONS

This application claims priority from U.S. Provisional Patent Application No. 62/853,951 filed May 29, 2019, the contents of which are incorporated herein by reference in their entirety.

CONTRACTUAL ORIGIN

This invention was made with government support under Contract No. DE-AC36-08GO28308 awarded by the Department of Energy and Contract No. DMR-1806152 awarded by the National Science Foundation. The government has certain rights in the invention.

SUMMARY

An aspect of the present disclosure is a composition that includes a sequestering material capable of binding a target material, where the sequestering material includes a first component that includes at least one of a functional group, a molecule, an oligomer, or a polymer, and the target material includes at least one of an element, a chemical, and/or a compound. In some embodiments of the present disclosure, the element may include at least one element from at least one of Rows 4, 5, 6, and 7 of the Periodic Table and/or an inner transition metal. In some embodiments of the present disclosure, the element may include at least one of cadmium, lead, tin, germanium, bismuth, thallium, chromium, mercury, antimony, and/or arsenic. In some embodiments of the present disclosure, the target material may include $Pb^{2+}$.

In some embodiments of the present disclosure, the first component may include at least one of hydrogen, phosphorus, nitrogen, sulfur, oxygen, carbon, and/or silicon. In some embodiments of the present disclosure, the first component may include at least one of a phosphonic group, a phosphate group, a phosphoryl group, a phosphono group, a phosphor group, and/or a phosphoryl group. In some embodiments of the present disclosure, the first component may have a structure defined by

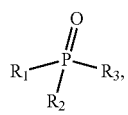

where each of $R_1$, $R_2$, and $R_3$ include at least one of hydrogen, oxygen, and/or carbon. In some embodiments of the present disclosure, the structure may be defined by

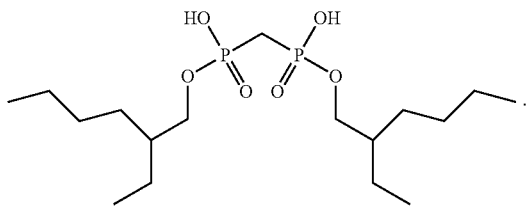 [SMILES: CCCCC(CC)COP(=O)(O)CP(=O)(O)OCC(CC)CCCC]

In some embodiments of the present disclosure, the first component may include at least one of DMDP, EDTMP, dimercaptosuccinic acid (DMSA), ethylenediaminetetraacetic acid (EDTA), nitrilotriacetic acid (NTA), ethylenediaminedisuccinic acid (EDDS), iminodisuccinic acid (IDS), methylglycine diacetic acid (MGDA), L-Glutamic acid N,Ndiacetic acid (GLDA), 2-hydroxyethyliminodiacetic acid (HEIDA), ethylenediamine-N,N'-dimalonic acid (EDDM), ethylenediamine-N,N'-diglutaric acid (EDDG), 3-hydroxy-2,2-iminodisuccinic acid (HIDS), and/or 2,6-pyridine dicarboxylic acid (PDA), poly ethylene glycol (PEG), poly vinyl alcohol, poly vinyl pyrrolidone, and/or a cellulose-based material.

In some embodiments of the present disclosure, the sequestering material may further include a matrix material. In some embodiments of the present disclosure, the matrix material may include at least one of a polymer and/or an oligomer. In some embodiments of the present disclosure, the matrix material may include at least one of PVA, PEO, a polyacrylate, a derivative of a polyacrylate, polyvinylpyrrolidone, an oxide, a glass, and/or a silicone gel. In some embodiments of the present disclosure, the first component and the matrix material may be present at a first ratio between about 0.001 grams of the first component per gram of the matrix material and about 100 grams of the first component per gram of the matrix material.

In some embodiments of the present disclosure, the sequestering material may be substantially transparent to light having a wavelength between about 300 nm and about 1200 nm. In some embodiments of the present disclosure, the sequestering material may have a solubility product constant value, $K_{sp}$, for the target material between about $10^{-60}$ and about 1. In some embodiments of the present disclosure, the sequestering material may have a capacity to absorb water at a second ratio between about 0.01 grams of water per gram of the sequestering material and about 100 grams of water per gram of the sequestering material. In some embodiments of the present disclosure, the composition may be used as at least one of a coating or a paint.

An aspect of the present disclosure is a device that includes a first feature that includes a sequestering material, and a second feature that includes a target material, where the sequestering material is capable of binding the target material, the sequestering material includes a first component that includes at least one of a functional group, a molecule, an oligomer, and/or a polymer, and the target material includes at least one of an element, a chemical, and/or a compound. In some embodiments of the present disclosure, the first feature may include a first planar structure, the second feature may include a second planar structure, where the first planar structure and the second planar structure may be adjacent and substantially parallel to one another.

An aspect of the present disclosure is a method for sequestering a target material, where the method incudes applying a composition that includes a sequestering material to a device having a feature that includes the target material, where over a period of time, a portion of the target material is removed from the feature due to exposure to the environment, and the sequestering material binds the portion of the target material, preventing its leakage into the environment.

BRIEF DESCRIPTION OF THE DRAWINGS

Some embodiments are illustrated in referenced figures of the drawings. It is intended that the embodiments and figures disclosed herein are to be considered illustrative rather than limiting.

REFERENCE NUMBERS

Figure 1A:
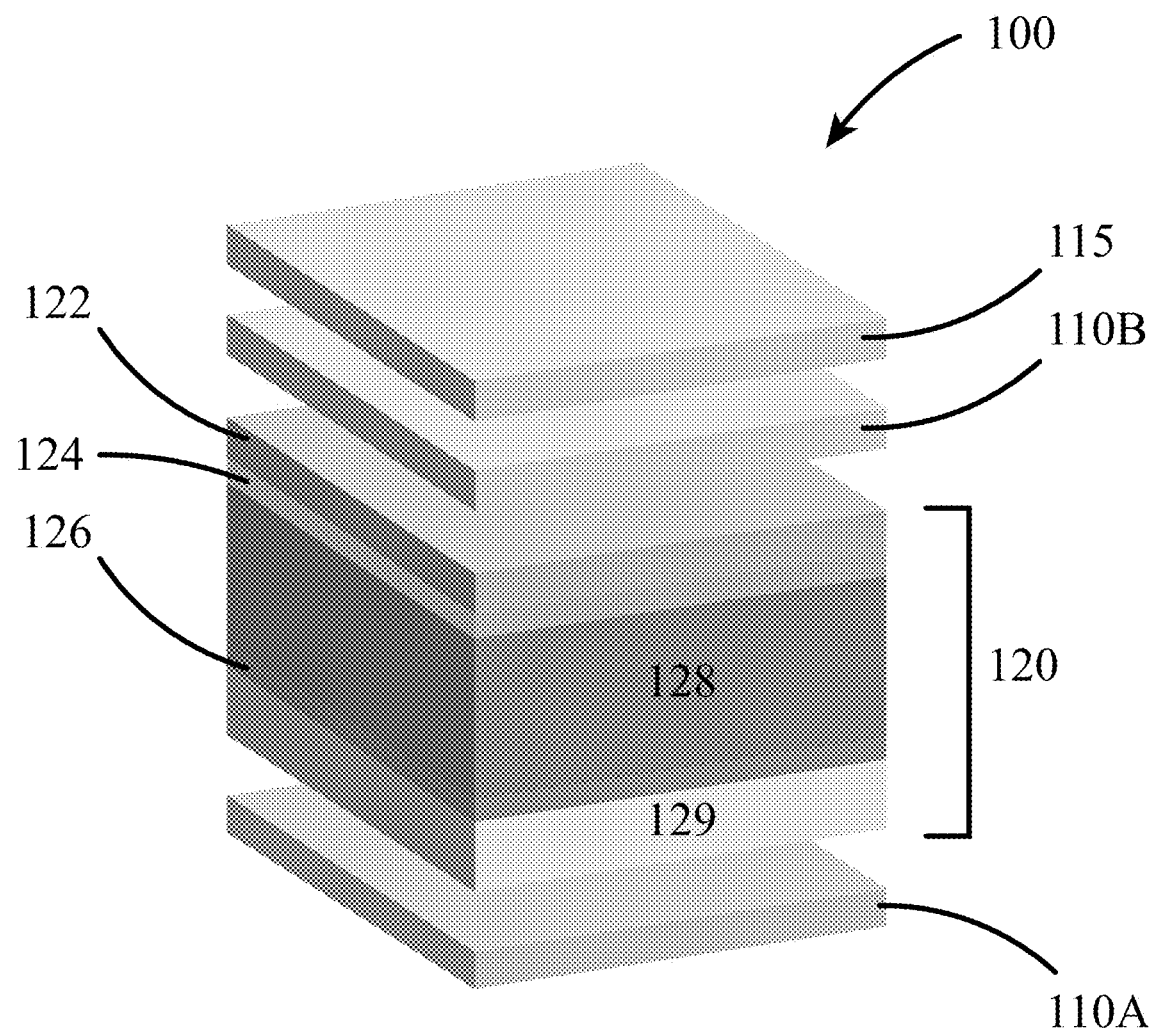
FIG. 1A illustrates a schematic of Pb-sequestering layers on both the front (glass) and back (metal electrode) sides of a standard n-i-p perovskite solar cell (FTO glass/TiO$_2$/perovskite/spiro-OMeTAD/Au), according to some embodiments of the present disclosure. A first layer of P,P'-di(2-ethylhexyl)methanediphosphonic acid (DMDP) as a sequestering material was coated on the glass side and a second layer of N,N,N',N'-ethylenediaminetetrakis(methylenephosphonic acid) and polyethylene oxide (EDTMP-PEO) as a sequestering material was added on the metal electrode side, which was further covered by ethylene vinyl acetate (EVA) to provide a sealant, according to some embodiments of the present disclosure.

| | |
|---|---|
| 100 | device |
| 110 | layer of sequestering material |
| 115 | packaging layer |
| 120 | stack |
| 122 | conducting layer |
| 124 | hole transport layer |
| 126 | electron transport layer |
| 128 | active layer |
| 129 | conducting layer |

DETAILED DESCRIPTION

The embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

As used herein, the term "photovoltaic device" includes solar cells, solar panels, solar modules, and/or solar arrays. In addition, a "photovoltaic device" may include at least one of a photovoltaically active material, a charge-transport material, a current collecting material, a reflecting material, and/or any other material and/or elements utilized in a particular photovoltaic device design. Further examples of features potentially contained in devices utilizing at least one of the element- and/or molecule-sequestering compositions and/or materials described herein include busbars, solder, welds, front shielding glass, encapsulant materials, insulating back sheets, back cover layers, and/or other support structures. A "photovoltaic device" may include single-junction and/or multiple-junction devices. As used herein, the term "feature" refers to a distinct physical part of a device and/or a material and/or a composition used to construct a device. As used herein, the term "sequestering material" refers to a molecule, oligomer, polymer, composition, and/or mixture that is capable of capturing, absorbing, adsorbing, and/or reacting with at least one target material, resulting in the sequestration of the target material within and/or on a surface of the sequestering material. As used herein, the term "target material" refers to any element, chemical, and/or compound whose release into the environment from a particular manufactured device is undesirable.

The term "polymer", as used herein, refers to a molecule of high relative molecular mass, the structure of which comprises the multiple repetition of units derived, actually or conceptually, from molecules of low relative molecular mass. In certain embodiments, a polymer is comprised of only one monomer species (e.g., polyethylene oxide). In certain embodiments, a polymer of the present invention is a copolymer, terpolymer, heteropolymer, block copolymer, or tapered heteropolymer of one or more epoxides. The term "oligomer" refers to a molecule constructed of monomer species similar to a polymer, but having a lower molecular mass, relative to a polymer.

The present disclosure relates to sequestering materials, compositions containing sequestering materials, and/or devices containing sequestering materials, capable of sequestering various target materials, in the form of elements, compounds, ions, and/or molecules, contained within one or more features of a device, including, among other elements, metals and/or metalloids. Metals, as an example of the target materials, include at least one of main group metals, transition metals, and/or inner transition metals. As described herein, sequestering materials, compositions and/or devices may minimize and/or eliminate the migration of harmful metals from these materials, compositions, and/or devices into the environment. Some examples of target materials that may be sequestered using some embodiments of the sequestering materials, compositions, and/or devices described herein include at least one of lead, tin, germanium, cadmium, copper, indium, gallium, mercury, bismuth, chromium, iron, copper, zinc, aluminum beryllium, ruthenium, nickel, cobalt, manganese, silver, thallium, indium, antimony, germanium, selenium, tellurium, and/or arsenic (an example of a metalloid), iodine, bromine, chlorine, and/or fluorine. Some embodiments of the present disclosure may be utilized to sequester elements and/or molecules contained in photovoltaic devices, light-emitting diodes (LEDs), solar windows, sensors, displays, X-ray detectors, memristors and/or any other metal-containing and/or metalloid-containing electronic devices and optoelectronic devices, as well as non-electronic metal-containing objects such as pipes and/or metal-containing surfaces such as walls, ceilings, and/or floors coated with lead-containing paint. The elements and/or molecules sequestered by the materials and compositions described herein may be in any valence state (e.g. $Pb^{2+}$).

In some embodiments of the present disclosure, only one feature of an electronic device may utilize at least one of the sequestering materials described herein. For example, only an active layer of a solar cell, containing the element and/or molecule to be sequestered (i.e. target material), may utilize at least one of the sequestering materials described herein; e.g. the active layer may be substantially encapsulated by a sequestering material. In some embodiments of the present disclosure, more than one feature of an electronic device may utilize at least one of the sequestering materials described herein. For example, an active layer and a charge-transport layer of a photovoltaic device may both utilize at least one of the sequestering materials described herein; e.g. both the active layer and the charge-transport layer may be substantially encapsulated by a sequestering material. Similarly, other electronic devices (e.g. LEDs, sensors, displays, etc.) may contain one or more features having the target material to be sequestered that utilize at least one of the sequestering materials described herein. Thus, in some embodiments of the present disclosure, any device and/or feature of a device containing a hazardous element and/or material (i.e. target material) may be at least partially covered and/or encapsulated by the sequestering materials described herein, such that the hazardous element and/or material is not released into the environment during the life-span of the device and/or its time spent in the environment.

In some embodiments of the present disclosure, a feature of a device may include a material having an element and/or molecule to be sequestered (e.g. an active material), where a sequestering material and/or composition is mixed with the material containing the target material to form a composite material. In some embodiments of the present disclosure, a sequestering material may form a single homogenous phase (e.g. solid phase and/or liquid phase) with the material it is mixed with. In some embodiments of the present disclosure, a sequestering material may form a heterogeneous phase (e.g. solid phase and/or liquid phase) with the material it is mixed with. For example, a sequestering material may be dispersed as a first solid phase in a second continuous solid phase of a material containing the target material to be sequestered. Alternatively, a sequestering material may be a first continuous solid phase, with the material (containing the target material) it is mixed with dispersed as a second solid phase within the continuous solid phase of the sequestering material.

In another example, a feature of an electronic device constructed of a material containing a target material, e.g. an element and/or molecule, to be sequestered may have a surface that is adjacent to a sequestering material. As used herein, the term "adjacent" refers to two features that are either in direct physical contact and/or closely associated with each other. For example, a first layer adjacent to a second layer may be in direct physical contact or there may be at least one intervening layer positioned between the first layer and the second layer. Thus, in some embodiments of the present disclosure a device may be constructed as a three-dimensional object and/or include a three-dimensional feature having one or more external surfaces, with examples including amorphous particles, planar structures, spheres, cylinders, cuboids, cones, pyramids, polyhedrons, and/or any other shape required for a specific device and/or application. In some embodiments of the present disclosure, at least one surface of a device and/or feature of a device may be positioned adjacent to a sequestering material. For example, the outer surface of a particle containing a target material to be sequestered may be substantially coated with a sequestering material. In another example, a surface of a planar device containing a target material may be positioned adjacent to a layer including a sequestering material. In another example, a surface of a planar device containing a target molecule may be positioned between a first layer and a second layer, where both the first layer and the second layer include a sequestering material. In some embodiments of the present disclosure, an intervening layer may be substantially permeable to the targeted material. In some embodiments of the present disclosure, an intervening layer may be substantially impermeable to the targeted material.

Examples of active materials that may utilize at least one of the sequestering materials described herein include, but are not limited to, at least one of a perovskite, a quantum dot (i.e. nanocrystal), a polymer, and/or an alloy, with or without at least one metal. Examples of perovskites include perovskites described by the general formula $ABX_3$, where X is an anion and A and B are cations. In some embodiments of the present invention, the A-cation may include a nitrogen-containing organic compound such as an alkyl ammonium compound. The B-cation may include a metal and the X-anion may include a halogen. Additional examples for the A-cation include organic cations and/or inorganic cations, for example Cs, Rb, K, Na, Li, and/or Fr. Organic A-cations may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations include methylammonium ($CH_3NH_3^+$), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH=NH_2^+$), hydrazinium, acetylammonium, dimethylammonium, imidazolium, guanidinium and/or any other suitable nitrogen-containing and/or organic compound. In other examples, an A-cation may include an alkylamine. Thus, an A-cation may include an organic component with one or more amine groups. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$) ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations include, for example, lead, tin, germanium, and or any other 2+ valence state metal that can charge-balance the perovskite. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples of X-anions include halogens: e.g. fluorine, chlorine, bromine, iodine and/or astatine. In some cases, the perovskite halide may include more than one X-anion, for example pairs of halogens; chlorine and iodine, bromine and iodine, and/or any other suitable pairing of halogens. In other cases, the perovskite may include two or more halogens of fluorine, chlorine, bromine, iodine, and/or astatine.

Thus, the A-cation, the B-cation, and X-anion may be selected within the general formula of $ABX_3$ to produce a wide variety of perovskites, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite may have more than one halogen element, where the various halogen elements are present in non-integer quantities; e.g. x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, which may possess the same unit structure. As described herein, the A-cation of a perovskite, may include one or more A-cations, for example, one or more of cesium, FA, MA, etc. Similarly, the B-cation of a perovskite, may include one or more B-cations, for example, one or more of lead, tin, germanium, etc. Similarly, the X-anion of a perovskite 100 may include one or more anions, for example, one or more halogens. Any combination is possible provided that the charges balance.

Further, a perovskite in at least one of a cubic, orthorhombic, and/or tetragonal structure, may have other compositions resulting from the combination of the cations having various valence states in addition to the 2+ state and/or 1+ state described above for lead and alkyl ammonium cations; e.g. compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with examples of such a composition being $Cs_2BiAgCl_6$ and $Cs_2CuBiI_6$. Another example of a composition within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations. Another example of a composition within the scope of the present disclosure is 2D layered perovskites, which are generally described by $M_2A_{n-1}B_nX_{3n+1}$, where M is a large cation, such as BA=butylammonium, PEA=phenylethylammonium, CA=cyclopropylammonium, PEI=polyethylenimine, IEA=iodoethylammonium, EDA=ethane-1,2-diammonium, or AVA=ammoniumvaleric acid; A is methylammonium (MA), formamidinium (FA), or Cs; B is Pb or Sn; X is a halide anion, namely, I, Br, or Cl; and n is the number of layers of metal halide sheets. The limit of n=∞ corresponds to the 3D perovskite.

In some embodiments of the present disclosure, a device that includes sequestering materials may include features that include quantum dots (i.e. nanocrystal). In some embodiments of the present disclosure, a quantum dot may be constructed of various semiconducting alloys, including, for example, Pb Se, PbS, CdSe, CdS, CdTe, and/or other Pb and/or Cd containing materials. Other active materials include CdTe, Si, I-III-VI$_2$ compounds such as $CuIn_xGa_{1-x}Se_2$, where x may be between 0 and 1, inclusively, and III-V compounds such as GaAs. In some embodiments of the present disclosure, a device may include more than one active material, such as in multiple-junction photovoltaic devices.

In some embodiments of the present disclosure, a sequestering material (e.g. metal-sequestering composition) may include a compound configured to interact with a metal by at least one of chelation, binding, reacting, ionically interacting, and/or physically adsorbing the metal. As used herein, the terms "binding" and "bonding" refer to charge-charge interactions between neighboring atom, ions, and/or molecules. As used herein, the term "chelating" refers to a type of bonding of ions and molecules to metal ions, which involves the formation or presence of two or more separate coordinate bonds between a polydentate (multiple bonded) ligand and a single central atom. These ligands are called chelants, chelators, chelating agents and/or extractants, which can include organic compounds. In some embodiments of the present disclosure, a sequestering material for sequestering a target material may include at least one of a ketone, an aldehyde, a carboxylic acid, an ester, an ether, and/or a carbonate. In some embodiments of the present disclosure, a sequestering material for sequestering an element and/or molecule may include at least one of hydrogen, phosphorus, nitrogen, sulfur, oxygen, carbon, and/or silicon.

For example, a sequestering material may include at least one of an amine group, an amide group, a hydrazine group, an isocyanate group, a nitrile group, and/or a nitrite group. Additional nitrogen-containing groups that may sequester a metal include at least one of an amino group (primary, secondary, and/or tertiary), an imino group, an imido group, a hydrazine group, a cyanate group, an isocyano group, an isocyanato-nitrooxy group, a cyano group, a nitrosooxy group, a nitroso group, a pyridyl group, and/or a carboxamido group. Sulfur-containing groups that may sequester a metal include at least one of a thiol group, a sulfide group, a disulfide group, a sulfoxide group, a sulfone group, a sulfinic acid group, a sulfonic acid group, a thiocyanato group, a mercapto group, a sulfanyl group, a sulfinyl group, a sulfo group, a sulfonyl group, an isothiocyanato group and/or a disulfide group. Phosphorus-containing groups that may sequester an element and/or molecule include at least one of a phosphonic group, a phosphate group, a phosphoryl group, a phosphono group, a phosphor group, and/or a phosphoryl group. Carbon-containing groups that may sequester a metal include at least one of a C—OH group (carbon hydroxyl group), a carbonyl group, a carboxylate group. Silicon-containing groups that may sequester a metal include at least one of a silicate group, a siliconate group, a silane group, or a siloxane.

In some embodiments of the present disclosure, a sequestering material may include a compound having a structure defined by

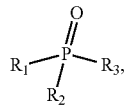

where at least one of $R_1$, $R_2$, and/or $R_3$ comprise at least one of hydrogen, oxygen, and/or carbon. For example, at least one of $R_1$, $R_2$, and/or $R_3$ may include at least one of an oxygen-containing group, a hydroxyl group, and/or an alkyl group.

In some embodiments of the present disclosure, a sequestering material may include a compound having a structure defined by

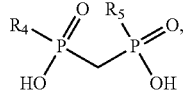

where at least one of $R_4$ and/or $R_5$ comprise at least one of hydrogen, oxygen, and/or carbon. For example, at least one of $R_4$ and/or $R_5$ may include at least one of an oxygen-containing group, a hydroxyl group, and/or an alkyl group.

In some embodiments of the present disclosure, a sequestering material may include a compound having a structure defined by

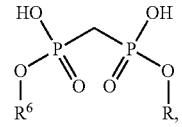

where at least one of $R^6$ and/or R comprise at least one of hydrogen, oxygen, and/or carbon. For example, at least one of $R^6$ and/or R may include at least one of an oxygen-containing group, a hydroxyl group, and/or an alkyl group.
In some embodiments of the present disclosure, a composition for sequestering an element and/or molecule may include P,P'-di(2-ethylhexyl)methanediphosphonic acid (DMDP) having a structure defined by

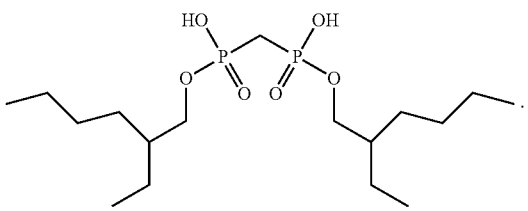 [SMILES: CCCCC(CC)COP(=O)(O)CP(=O)(O)OCC(CC)CCCC]

In some embodiments of the present disclosure, a composition for sequestering an element and/or molecule may include N,N,N',N'-ethylenediaminetetrakis(methylenephosphonic acid) (EDTMP) having a structure defined by

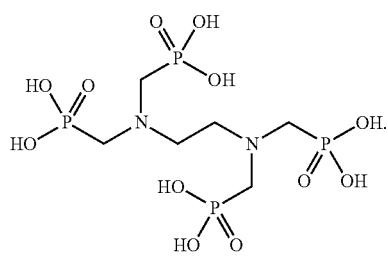 [SMILES: O=P(O)(O)CN(CCN(CP(=O)(O)O)CP(=O)(O)O)CP(=O)(O)O]

In some embodiments of the present disclosure, a sequestering material may include at least one of P,P'-di(2-ethylhexyl)methanediphosphonic acid (DMDP) and/or N,N,N', N'-ethylenediaminetetrakis(methylenephosphonic acid) (EDTMP). Other sequestering compositions that fall within the scope of the present disclosure include at least one of dimercaptosuccinic acid (DMSA), ethylenediaminetetraacetic acid (EDTA), nitrilotriacetic acid (NTA), ethylenediaminedisuccinic acid (EDDS), iminodisuccinic acid (IDS), methylglycine diacetic acid (MGDA), L-Glutamic acid N,Ndiacetic acid (GLDA), 2-hydroxyethyliminodiacetic acid (HEIDA), ethylenediamine-N,N'-dimalonic acid (EDDM), ethylenediamine-N,N'-diglutaric acid (EDDG), 3-hydroxy-2,2-iminodisuccinic acid (HIDS), and/or 2,6-pyridine dicarboxylic acid (PDA), poly ethylene glycol (PEG), poly vinyl alcohol, poly vinyl pyrrolidone and cellulose-based materials.

In some embodiments of the present disclosure, a sequestering material may have a capacity to sequester between 0.001 grams and 100 grams of the target material being sequestered per gram of the sequestering material, or between 0.01 grams and 10 grams per gram of the sequestering material. In some embodiments of the present disclosure, an elemental target material that may be sequestered by a sequestering material described herein includes elements from at least one of Rows 4, 5, 6, and/or 7 of the Periodic Table and/or an inner transition metal. For example, an element that may be sequestered by the sequestering materials described herein include at least one of cadmium, lead, tin, germanium, bismuth, thallium, chromium, mercury, antimony, and/or arsenic.

In some embodiments of the present disclosure, a sequestering material for sequestering a target material (e.g. an element and/or molecule) may further include a matrix material constructed of at least one of an organic material and/or an inorganic material. In some embodiments of the present disclosure, a sequestering material may be at least one of covalently bonded and/or ionically bonded to a matrix material. For example, a matrix material may include a polymer such as at least one of poly(vinyl alcohol) (PVA), poly(ethylene oxide) (PEO), a polyacrylate and/or its derivatives, and/or polyvinylpirrolidone. In some embodiments of the present disclosure, a matrix material may include at least one of an inorganic material and/or an organic-inorganic hybrid material such as an oxide, a glass and/or a silicone gel. Thus, as described herein, a sequestering material may include a first component, as described above, that has the ability to sequester a target material and a matrix material that among other things, may provide structural integrity and/or additional sequestering capacity for the target material.

In some embodiments of the present disclosure, a matrix material may have a capacity to absorb at least one of water, an aqueous liquid, and/or an aqueous solution. For example, water absorbed by a matrix material may include at least one of acidic water, basic water, deionized water, filtered water, and/or any naturally occurring water (e.g. rainwater, dew, fresh water, sea water, etc.). In some embodiments of the present disclosure, a matrix material may have a water capacity between about 0.1 gram of water per gram of matrix material and about 100 g of water per gram of matrix material. In some embodiments of the present disclosure, the capability to absorb water may enable and/or assist the sequestering material to sequester metal in water and prevent the migration of metal into the environment. The matrix materials may swell, rather than dissolve, when exposed to water; e.g. when the matrix material is submerged in standing water. This may enable the sequestering material to retain its structural integrity for subsequent handling, such as when recovering the target materials (e.g. metals) from the sequestering material and/or the sequestering material and its corresponding matrix material. In some embodiments of the present disclosure, a ratio of the sequestering material to the matrix material may be between about 0.01 grams of the sequestering material per gram of matrix material and about 10 grams of the sequestering material per gram of matrix material. In some embodiments of the present disclosure, a sequestering material and/or matrix material may be transparent to light. For example, a sequestering material and/or matrix material may be transparent to light having a wavelength between about 300 nm and about 1200 nm.

Thus, some embodiments of the present disclosure relate to perovskite solar cells (PSCs), which promise a high-efficiency and low-cost alternative in comparison to other photovoltaic (PV) technologies. However, PSCs can present toxicity challenges due to many perovskite formulations containing, among other elements, tin and/or lead. Rather than eliminating these elements from the perovskite materials, which would negatively impact the PV performance, the present disclosure provides a cost-effective solution to eliminate and/or minimize the loss of toxic elements and/or molecules from the PSC devices to the environment, while maintaining good PV performance metrics. Therefore, in general, the compositions, materials, devices and/or methods described herein provide in-situ passivation of leaked toxic materials (e.g. lead and/or tin) from devices containing these toxic materials. For example, in some embodiments of the present disclosure, a lead-containing perovskite layer (where lead is the target material) may be positioned between two layers containing a lead-sequestering material. For example, lead-sequestering materials may include strong lead-binding compounds, such as chelating agents for metal ions (e.g. $Pb^{2+}$). In some embodiments of the present disclosure, as described herein, a sequestering material may include covalently linked chemical functional groups that have a very small solubility product constant value, $K_{sp}$, for the target materials (e.g. lead ions), e.g. $K_{sp}$ between $10^{-60}$ and 1, with examples of functional groups including phosphonic acid and/or sulfonic acid groups. In general, the lower the value of $K_{sp}$, the greater the sequestration effect offered by the sequestering material. SP stand for "solubility product".

In addition, for the side that light (e.g. sunlight) enters a PV device, transparent sequestering materials (e.g. lead-sequestering compositions) may be used so that the sequestering materials do not negatively impact the light-harvesting capabilities of the devices. In addition, some embodiments of the sequestering materials described herein may be insoluble in water while simultaneously providing a high capacity to absorb water with a high swelling ratio, such that the sequestering materials maintain their structural integrity, even when immersed in water. To achieve this, as described above, some embodiments of the present disclosure may include a matrix material that includes, among other things, at least one of a polymer and/or a molecule constructed of organic-inorganic compositions that form robust, high swelling rate structures (e.g. films) in the presence of water. As described above, in some embodiments of the present disclosure, a matrix material itself may be the sequestering material, where sequestering functional groups are covalently bonded to the polymer and/or small molecule. In other embodiments of the present disclosure, a matrix material may provide a storage capacity for water, whereas the sequestering material is a second material mixed with the matrix material. Regardless, as shown herein, when immersed in water, these lead-absorbing sequestering materials remain structurally integrated (rather than dissolving into small molecules), enabling, among other things, the easy identification and/or separation of the sequestering material containing the target material, due to, for example, the destruction of the device. As shown herein, in some embodiments of the present disclosure, greater than 99% lead sequestration of the target material can be achieved in lead-containing devices designed to include the lead-sequestering materials described herein, even upon mechanical destruction of the devices and immersion in water.

FIG. 1A illustrates a device configuration, according to some embodiments of the present disclosure. This exemplary device 100 includes a typical perovskite solar cell (PSC) stack 120, including a perovskite active layer 128 positioned between an electron transport layer 126 (e.g. $TiO_2$) positioned on a first conducting layer 129 (e.g. fluorine-doped tin oxide (FTO)) and a hole transport layer 124 (e.g. Spiro-OMETAD) and a second conducting layer 122 (e.g. gold). The PSC stack 120 is positioned between a first layer 110A of a sequestering material and a second layer 110B of a sequestering material. In addition, the device 100 of FIG. 1A includes a packaging layer 115 positioned on the second layer 110B. The first layer 110A of a sequestering material was applied to a substrate 129, in this example, an FTO/glass substrate. The lead-sequestering material of the first layer 110A included P,P'-di(2-ethylhexyl)methanediphosphonic acid (DMDP). The molecular structure of DMDP is shown above. The two phosphonic acid groups in each DMDP can strongly bind with one $Pb^{2+}$ based on the solubility constant $K_{sp}$ value ($8.1\times10^{-47}$) of lead phosphate.

Figure 1B:
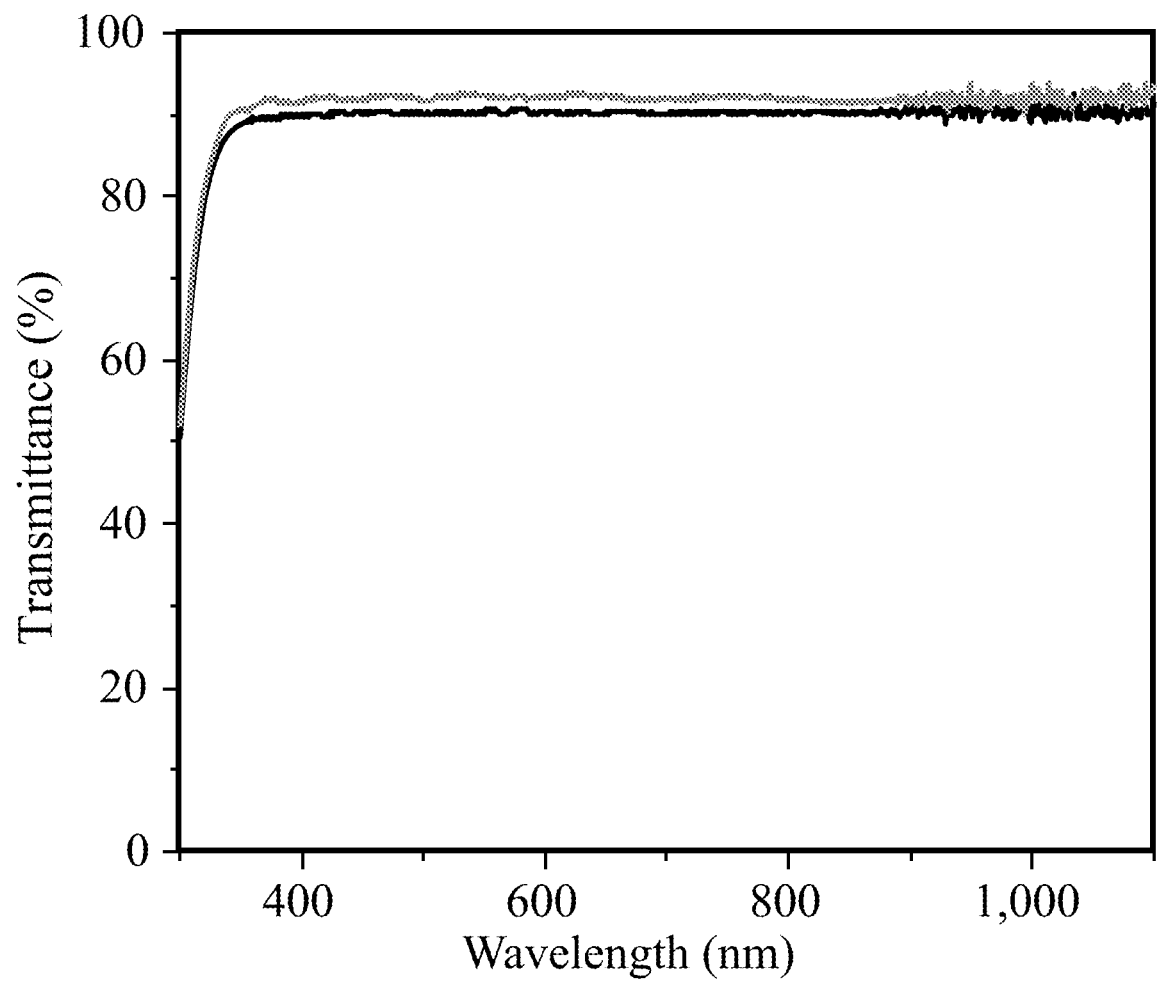
FIG. 1B illustrates the optical transmittance of a glass substrate with a DMDP layer (lighter line) and without a DMDP layer (darker line), according to some embodiments of the present disclosure.
Figure 2:
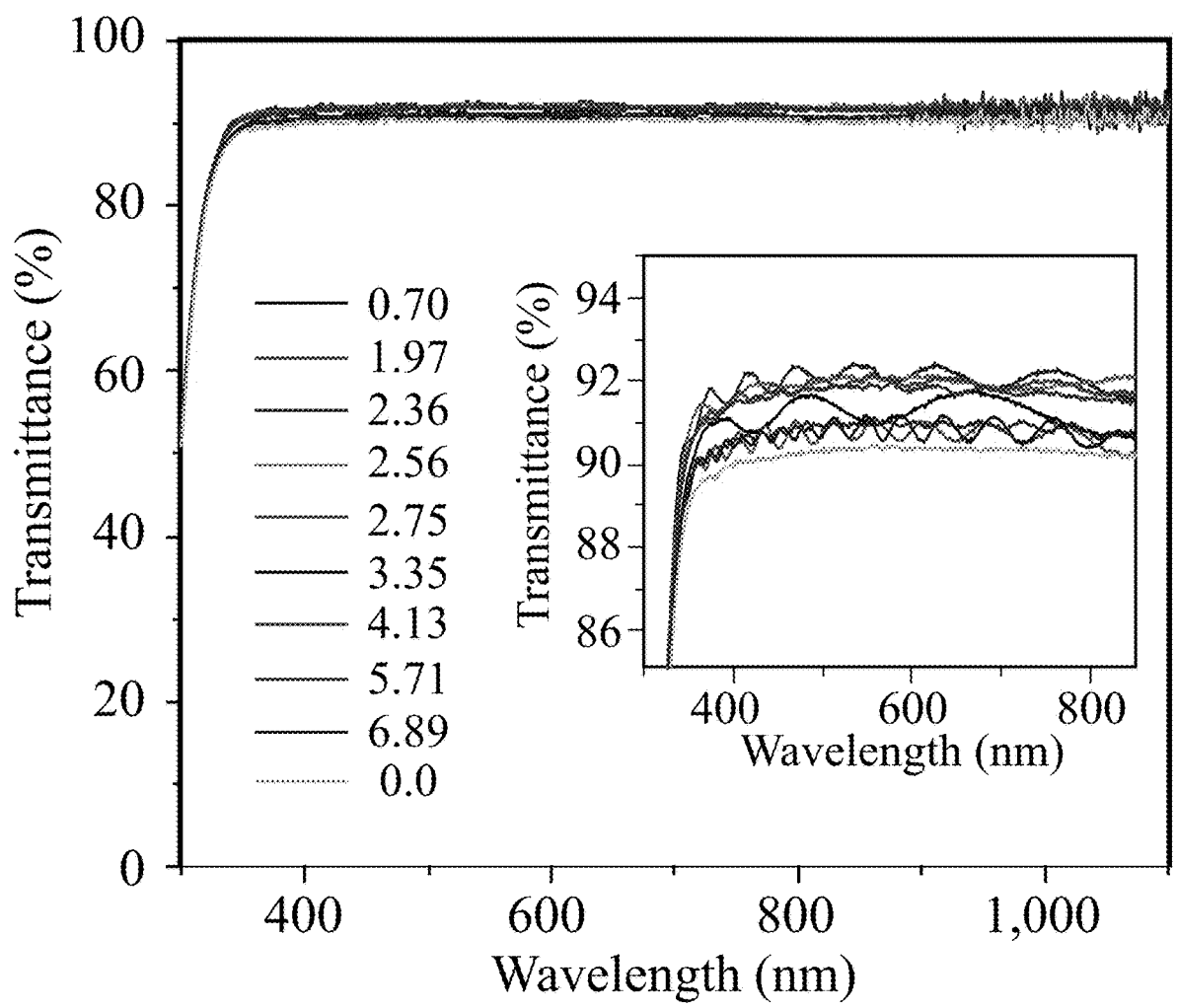
FIG. 2 illustrates the optical transmittance of DMDP films acting as lead-sequestering materials, with varying DMDP film thicknesses coated on glass, according to some embodiments of the present disclosure. The DMDP film thickness was varied from 0.7 to 6.89 μm. The numbers in the legend correspond to the thickness of the DMDP films in micrometers. The inset shows a magnified view of the transmittance spectra.

Another possible functional group for a lead-sequestering material includes lead sulfate ($K_{sp}=4.6\times10^{-8}$). DMDP is soluble in certain polar organic solvents (e.g., ethanol), allowing for facile film deposition by common coating methods (e.g., spin coating). The resultant DMDP-containing first film 110A is insoluble in water and swells slightly when immersed in water. Nevertheless, the functional phosphonic acid groups can effectively interact with $Pb^{2+}$ in water, for example, with lead present in water that infiltrates the device from the environment. For an exemplary device having a DMDP film with a thickness of about 2.36 μm, the amount of DMDP on a molar basis (~$6.19 \times 10^{-7}$ mol/cm$^2$) was almost twice as much as the amount of lead ($3.63 \times 10^{-7}$ mol/cm$^2$) contained in a typical PSC device, assuring adequate $Pb^{2\circ}$ binding sites were provided by the DMDP material alone. In addition, DMDP is highly transparent. As shown in FIG. 2, the transmittances for different thicknesses of DMDP on glass are all higher than that of pure glass (see inset). The transmittance of glass with a DMDP layer exhibits a wavelike feature (see FIG. 1B), which is attributed to the destructive interference of the visible lights transmitted at different interfaces.

In the exemplary device 100 of FIG. 1A, a second film 110B of a Pb-sequestering material on the back electrode side includes a strong lead-sequestering compound (e.g., N,N,N',N'-ethylenediaminetetrakis(methylenephosphonic acid) (EDTMP); structure shown above) mixed with a matrix material that includes a polymer to insure that the lead-free sequestering material and/or the sequestering material containing the sequestered lead cannot be removed by water. In some embodiments of the present disclosure, a matrix material (e.g. a polymer; not shown), included as a part of a sequestering material, may be capable of absorbing large amounts of water without being dissolved. Two environmentally friendly polymers suitable that were evaluated as matrix materials for sequestering materials are poly(vinyl alcohol) (PVA with molecular weight of about 86,000) and poly(ethylene oxide) (PEO with a molecular weight of about 2,000,000). These polymers were soaked in acetonitrile (ACN) to form a glue-like gel, to which EDTMP was added and mixed by stirring. In this example, the amount of EDTMP added was sufficient to provide 55 times the molar amount of lead present in the exemplary perovskite layer per unit area of the perovskite layer. The resultant lead-sequestering material was then converted to layers of the sequestering material (~0.45 mm in thickness) by a "doctor blade" method. After desiccation, flexible layers of the sequestering materials made of polymer/EDTMP blends (i.e. lead-sequestering materials) were obtained, which provided a second layer 110B of lead-sequestering material on the backside of the device 100 positioned between the second current collector 122 (e.g. Au) and the packaging layer 115, in this case, a layer of ethylene vinyl acetate (EVA).

Figure 3:
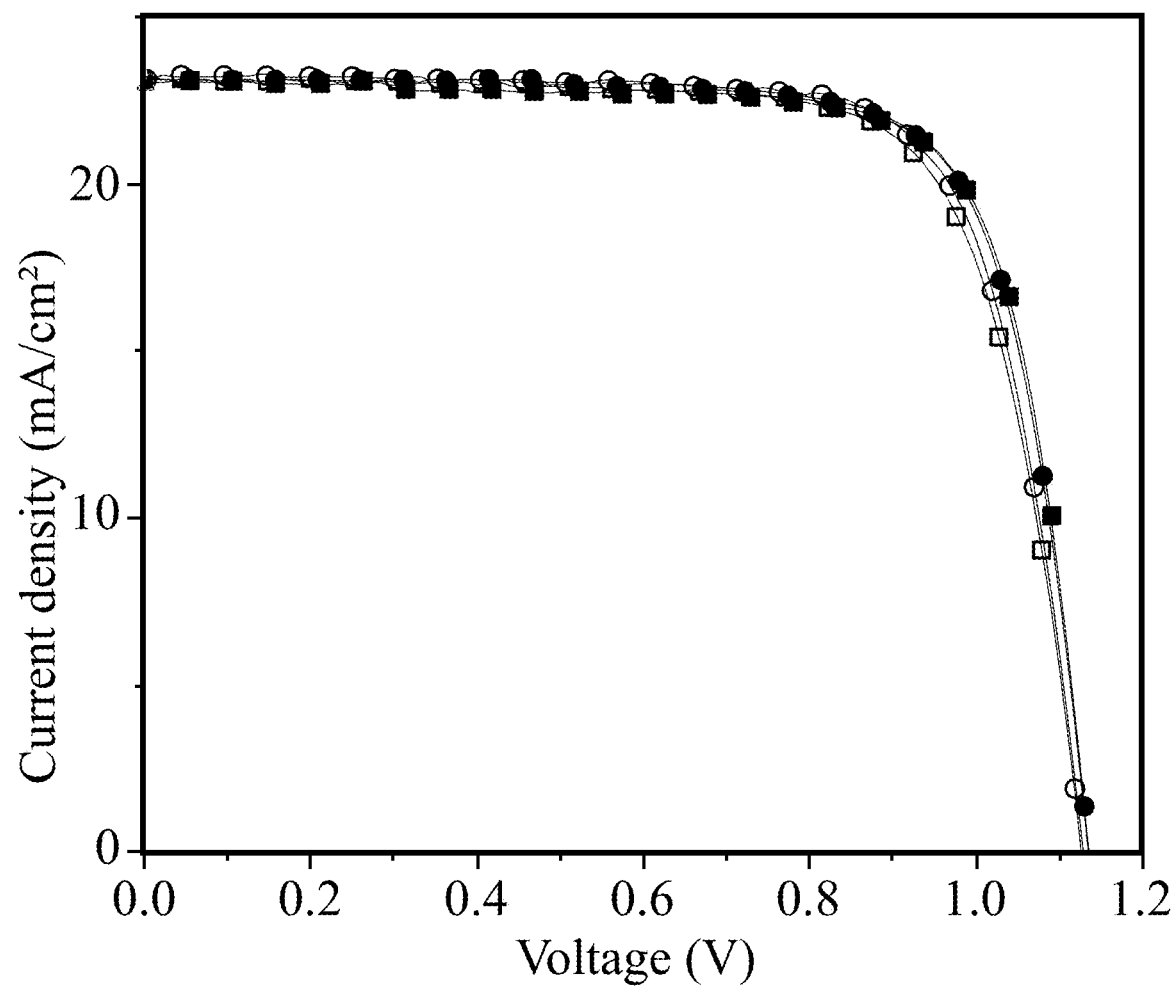
FIG. 3 illustrates the effects of the presence of packaging layers of EVA on the J-V curves of perovskite solar cells, data sets for solar cells with EVA layers and without EVA layers on the metal electrode side of the device, according to some embodiments of the present disclosure. Both forward and reverse voltage scans are shown. No clear effect on cell efficiency as a result of the EVA film is observed. Square markers represent devices lacking an EVA packaging layer; circular markers represent devices having an EVA packaging layer. Hollow markers represent reverse scans; solid markers represent forward scans.
Figure 4:
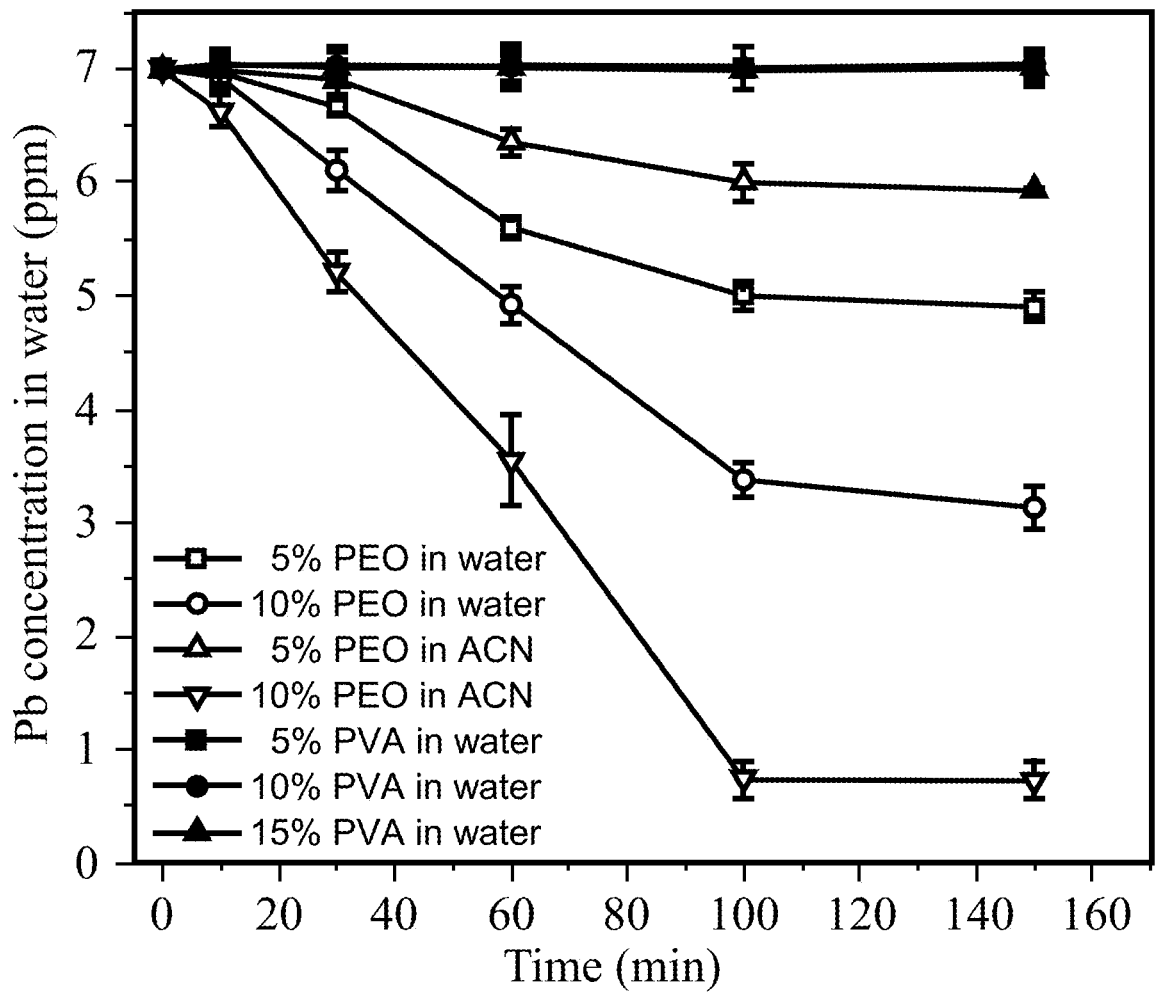
FIG. 4 illustrates the lead-sequestering capacity of sequestering materials made of mixtures of matrix materials (PEO and poly(vinyl alcohol) (PVA)) and EDTMP, specifically the lead-sequestering capabilities of lead-sequestering films made of various EDTMP-containing mixtures prepared by various methods and used as backside (metal electrode side) lead-sequestering layers, according to some embodiments of the present disclosure. The area of all the films was 2 cm×2 cm. The EDTMP-containing materials were soaked in 50 mL aqueous PbI$_2$ solutions having a lead concentration of 7 ppm. "5% PEO in DI" stands for an EDTMP-containing film prepared by dissolving 5 wt % polyethylene oxide (i.e. matrix material) in deionized water (DI) as a solvent, followed by the adding and mixing of the EDTMP. The mixture was then applied as a thin film by a doctor blade coating method with such an area that the concentration of EDTMP was about 0.01 g/cm$^2$. The film was desiccated and cut into the desired shape and size. ACN=acetonitrile as a solvent.

To ensure proper comparison in this study, all devices with a lead-sequestering layer and without a lead-sequestering layer were covered by a layer of EVA on the metal electrode side unless otherwise stated. As shown in FIG. 3, the packaging layer 115 of EVA alone did not affect the device J-V characteristics. Based on the rate and capacity of absorbing $Pb^{2+}$ in water (see FIG. 4), sequestering materials made of PEO polymer (i.e. matrix material) mixed with EDTMP (i.e. sequestering material) (denoted as EDTMP-PEO) appears to be a better choice than sequestering materials made of PVA polymers (i.e. matrix material) mixed with EDTEMP (i.e. sequestering material) (denoted as EDTMP-PVA), when utilized as a backside (i.e. dark side) lead-sequestering layer. Referring to FIG. 4, PEO and PVA are polymer components of sequestering materials, water and ACN are solvents, and the percentages refer to the weight percentages of PEO or PVA in the solvents. For clarity, referring again to FIG. 4, "in water" means that the sequestration film was prepared by dissolving the matrix material and the EDTMP sequestering material in water followed by removal of the water by desiccation. "in ACN" means that the sequestration film was prepared by dissolving the matrix material and EDTMP in ACN followed by removal of the ANC by desiccation. In general, ACN worked much better as a solvent than water for the purpose of preparing sequestration films/layers having both a matrix material and a sequestration material.

Figure 1C:
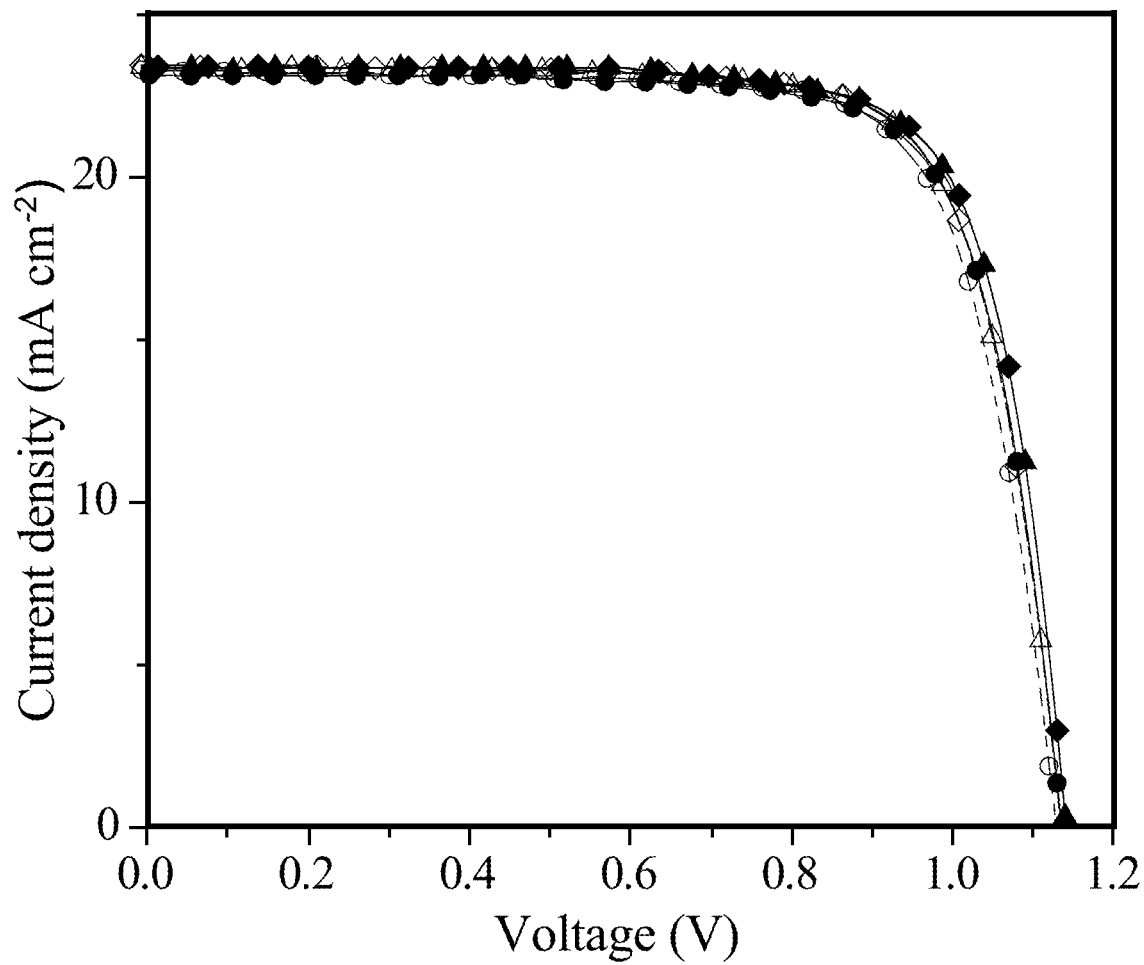
FIG. 1C illustrates a comparison of the J-V characteristics of devices lacking layers of sequestering materials (data set with circles), devices having a single layer of sequestering material on the glass-side (triangles), and devices with the PSC stack positioned between two layers of sequestering materials (diamonds), according to some embodiments of the present disclosure. Solid markers (circles, triangles, and diamonds) correspond to forward scans; hollow markers correspond to reverse scans.
Figure 5:
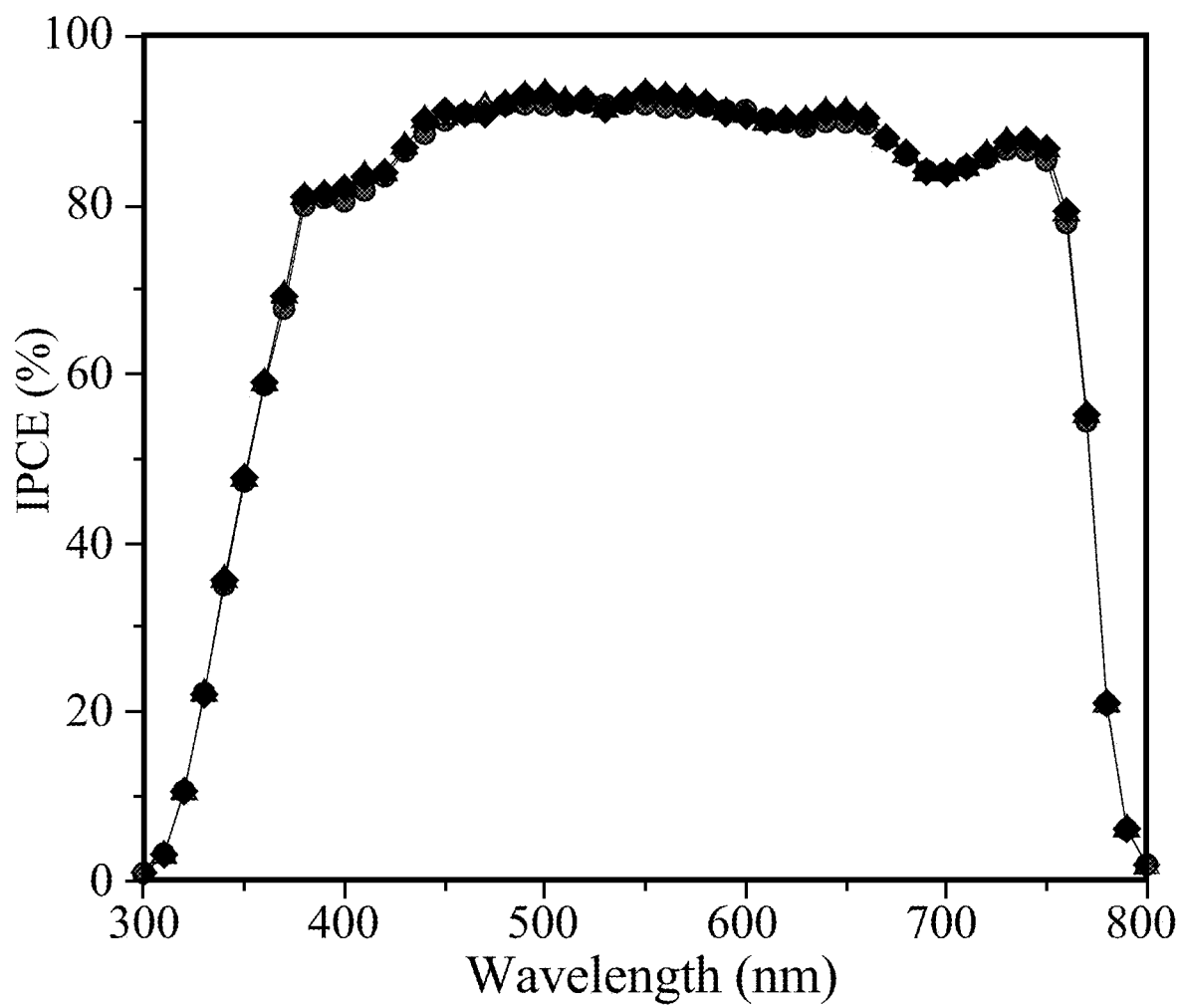
FIG. 5 illustrates IPCE spectra of devices with and without lead-sequestering layers, according to some embodiments of the present disclosure. The current densities obtained from integrated IPCE spectra are consistent with the J-V measurement. The data sets are marked the same as the data sets of FIGS. 1C and 1D.
Figure 6:
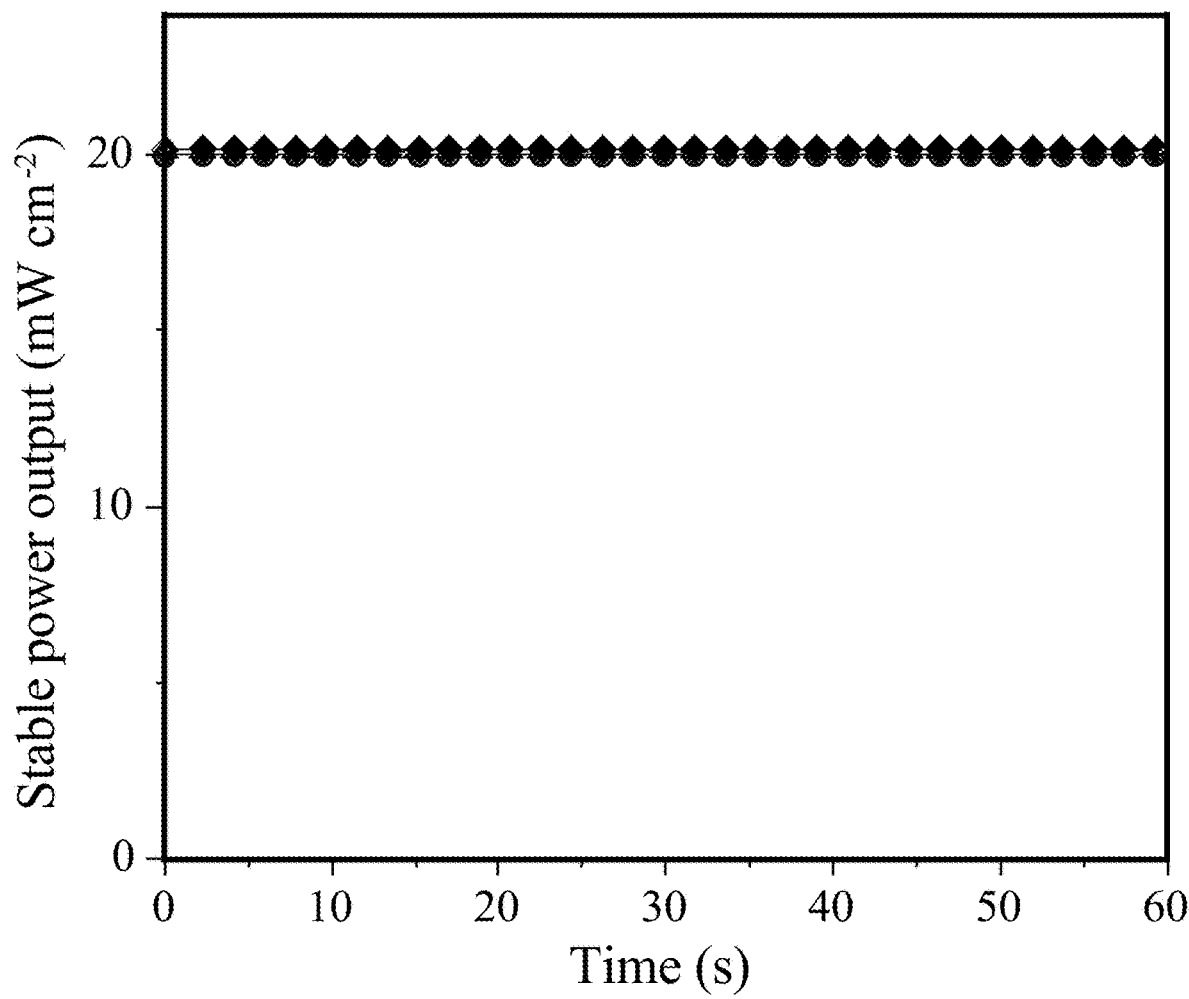
FIG. 6 illustrates stable power output (SPO) near the maximum power point of devices with and without lead-sequestering layers, according to some embodiments of the present disclosure. The SPO efficiencies are consistent with the efficiencies determined from the J-V measurement. The data sets are marked the same as the data sets of FIGS. 1C and 1D.
Figure 7A:
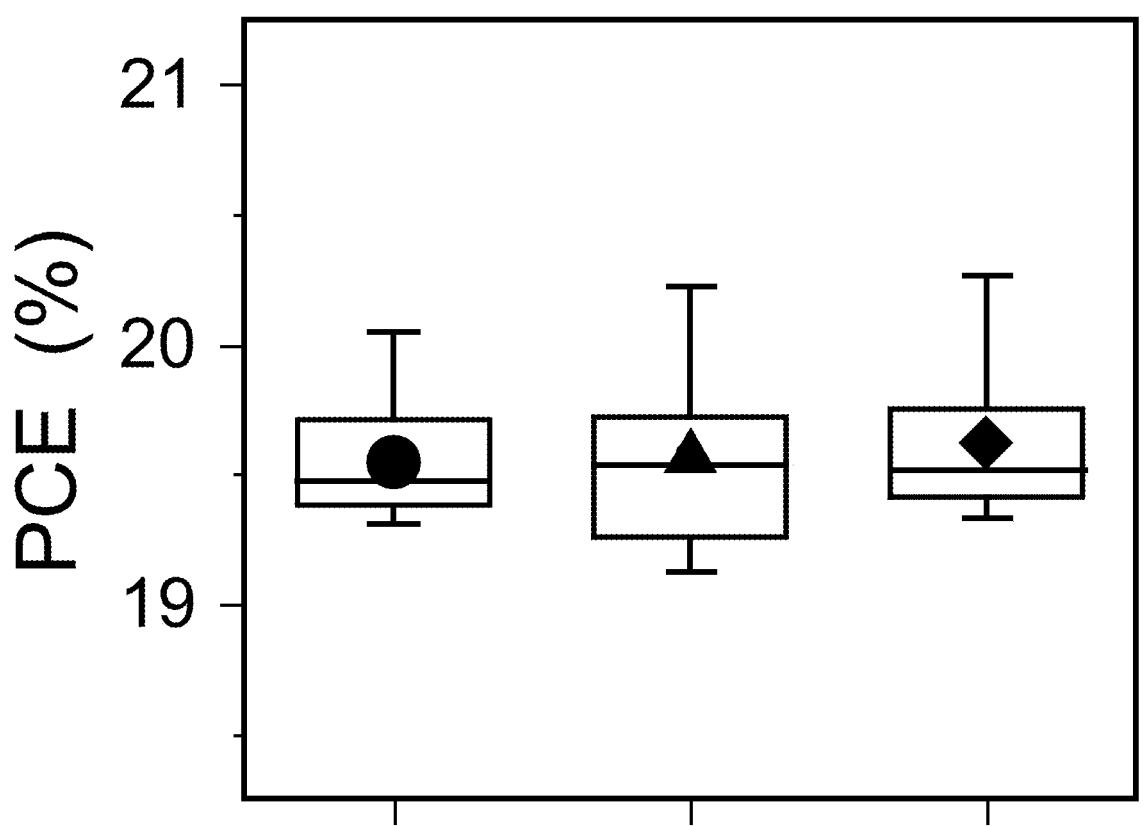
FIG. 7A illustrates statistics for the PCE of devices with and without lead-sequestering layers, according to some embodiments of the present disclosure. (Legend: circle=control (no sequestering materials); triangle=DMDP sequestering layer on the glass side; diamond=DMDP sequestering layer on the glass side and EDTMP-PEO sequestering layer on the metal electrode side.)
Figure 7B:
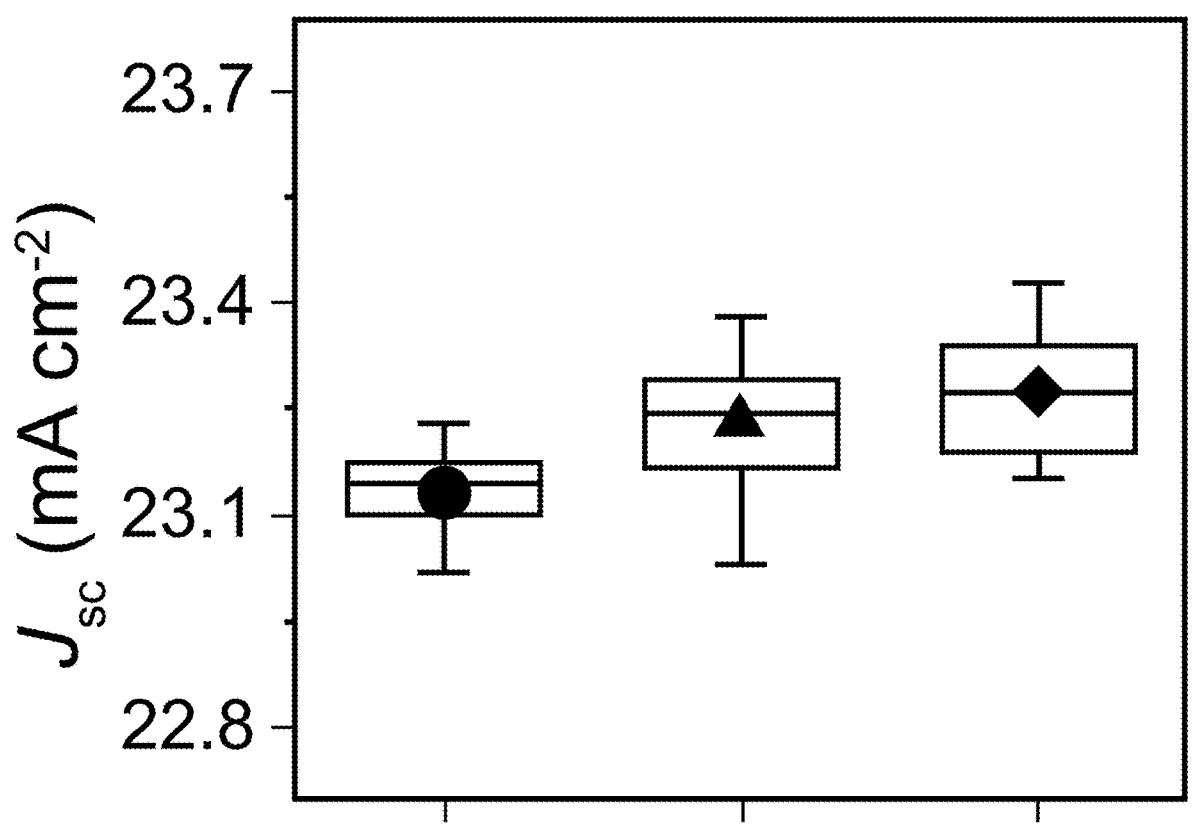
FIG. 7B illustrates statistics for the J$_{sc}$ of devices with and without lead-sequestering layers, according to some embodiments of the present disclosure. The data sets are marked the same as specified for FIG. 7A.
Figure 7C:
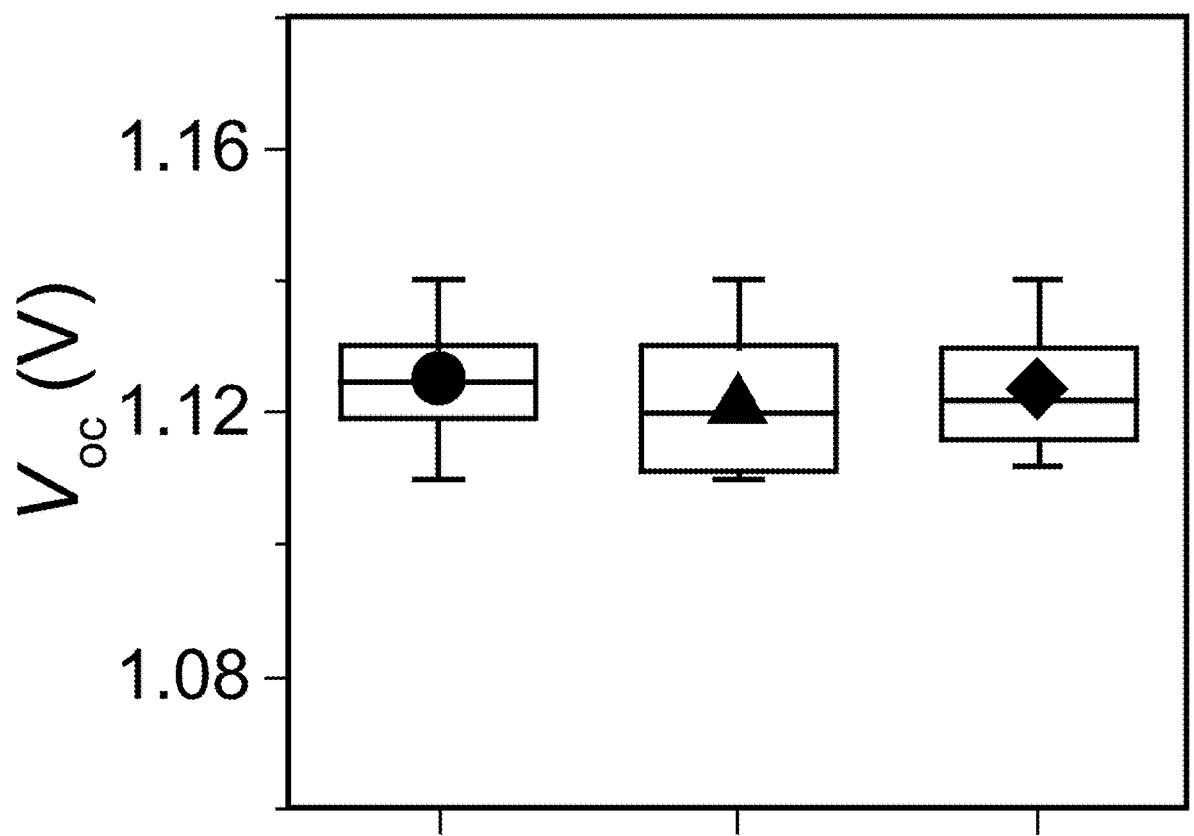
FIG. 7C illustrates statistics for the V$_{oc}$ of devices with and without lead-sequestering layers, according to some embodiments of the present disclosure. The data sets are marked the same as specified for FIG. 7A.
Figure 7D:
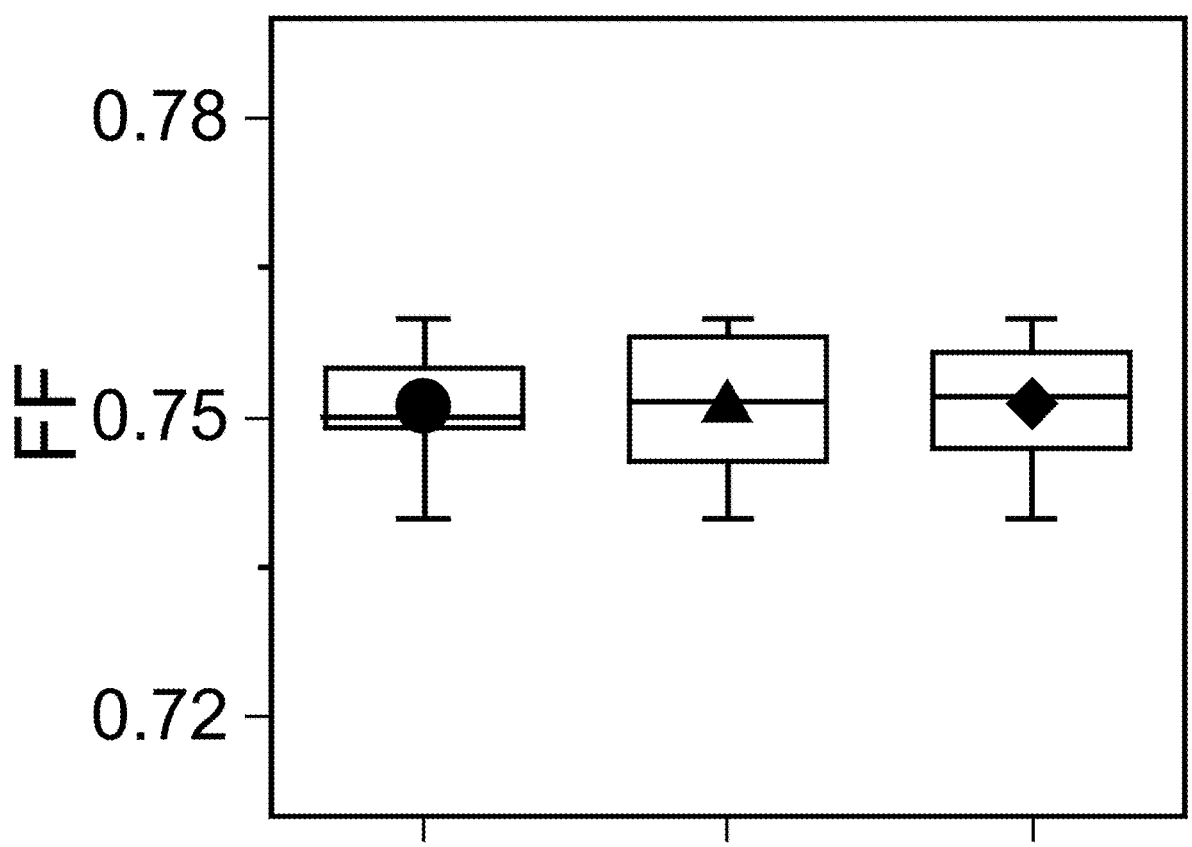
FIG. 7D illustrates statistics for the FF of devices with and without lead-sequestering layers, according to some embodiments of the present disclosure. The data sets are marked the same as specified for FIG. 7A.

In addition, PSCs were fabricated in three different configurations: (1) pristine control PSC devices (no lead-sequestering material included); (2) the control device plus a transparent DMDP-containing sequestering layer on the glass side; and (3) device (2) plus an additional EDTMP-PEO-containing sequestering layer positioned on the metal electrode side. All devices were covered with an EVA packaging layer (as shown in FIG. 1A). FIG. 1C illustrates J-V curves obtained for the three different configurations described above. FIG. 5 illustrates the corresponding incident photon-to-electron conversion efficiencies (IPCE) for the same device configurations. All the J-V curves with both forward- and backward-scans in the three configurations overlap with each other, indicating minimal affect by the layers of lead-sequestering materials on device performances. The details of the PV parameters are shown in Table 1. The stable power output (SPO) efficiencies were also examined and the SPO values are consistent with the measurement from the J-V curves due to the minimum hysteresis observed for these devices (see FIG. 6).

TABLE 1

| Sample | $V_{oc}$ (V) | $J_{sc}$ (mA cm$^{-2}$) | FF | PCE (%) |
|---|---|---|---|---|
| Control (reverse) | 1.13 | 23.23 | 0.75 | 19.69 |
| Control (forward) | 1.14 | 23.15 | 0.76 | 20.06 |
| Glass side coating (reverse) | 1.13 | 23.38 | 0.76 | 20.08 |
| Glass side coating (forward) | 1.14 | 23.35 | 0.76 | 20.23 |
| Double side coating (reverse) | 1.13 | 23.43 | 0.76 | 20.12 |
| Double side coating (forward) | 1.14 | 23.39 | 0.76 | 20.27 |

Figure 1D:
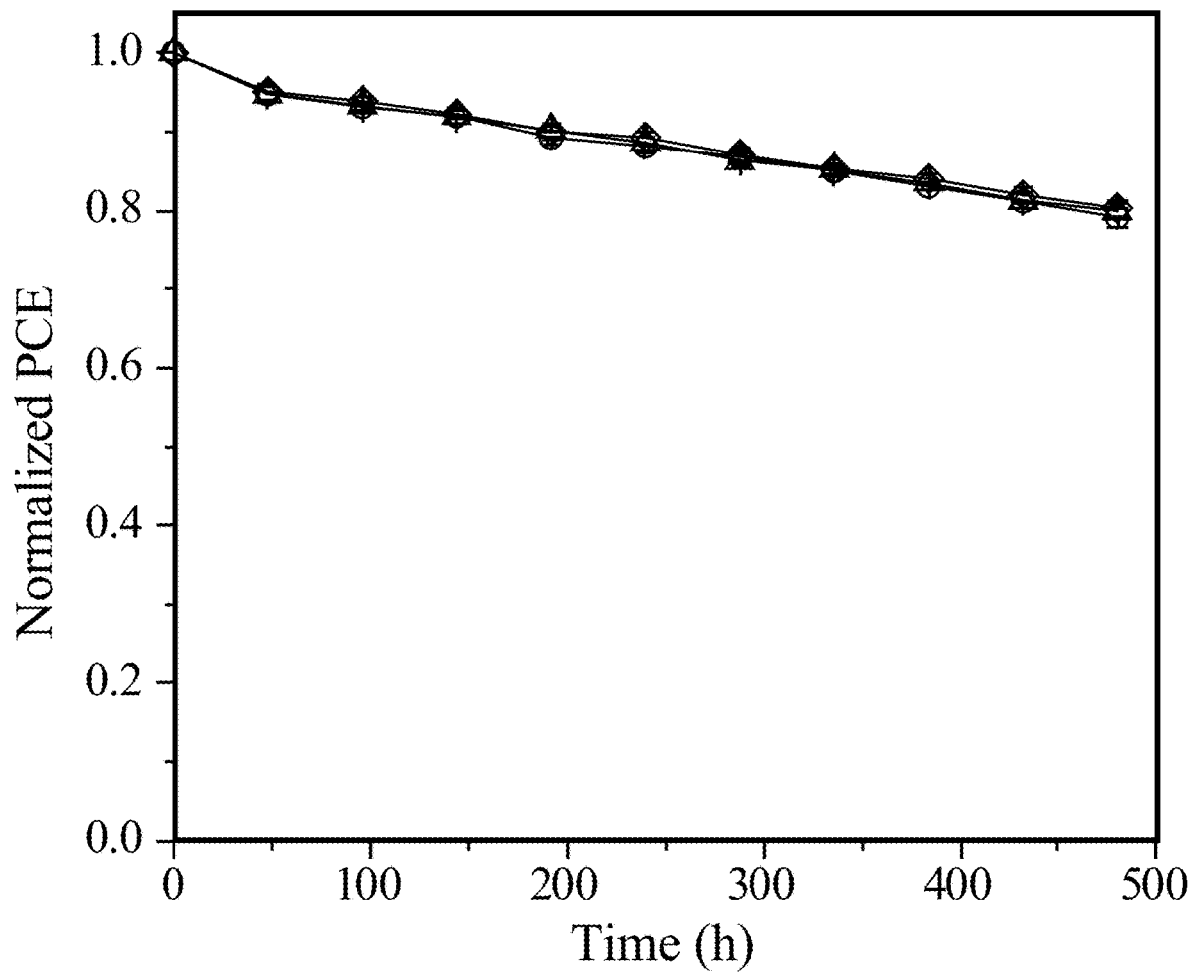
FIG. 1D illustrates the operational stability for devices with Pb-sequestering layers and without Pb-sequestering layers, according to some embodiments of the present disclosure. All devices were covered by a layer of EVA sealant, according to some embodiments of the present disclosure. The data sets are marked the same as the data sets of FIG. 1C.

FIGS. 7A, 7B, 7C, and 7D illustrate a statistical comparison of the device parameters (PCE, $J_{sc}$, $V_{oc}$, and FF, respectively) for the three device configurations, which further confirms that the layers of lead-sequestering materials do not deteriorate PSC performance. The long-term stability of these devices under continuous operation under simulated one-sun illumination intensity was also evaluated. This is especially important for the DMDP-containing sequestering layer as it is within the direct optical path for light harvesting. FIG. 1D compares the long-term PCE for the devices based on the three configurations with and without the addition of the lead-sequestering layers. For comparison, all devices were covered with an EVA layer (i.e. packaging layer) deposited on the metal electrode side. The results indicate that the processing and use of these exemplary lead-sequestering layers (especially the DMDP-containing sequestering layer) do not negatively impact long-term device performance.

Figure 8A:
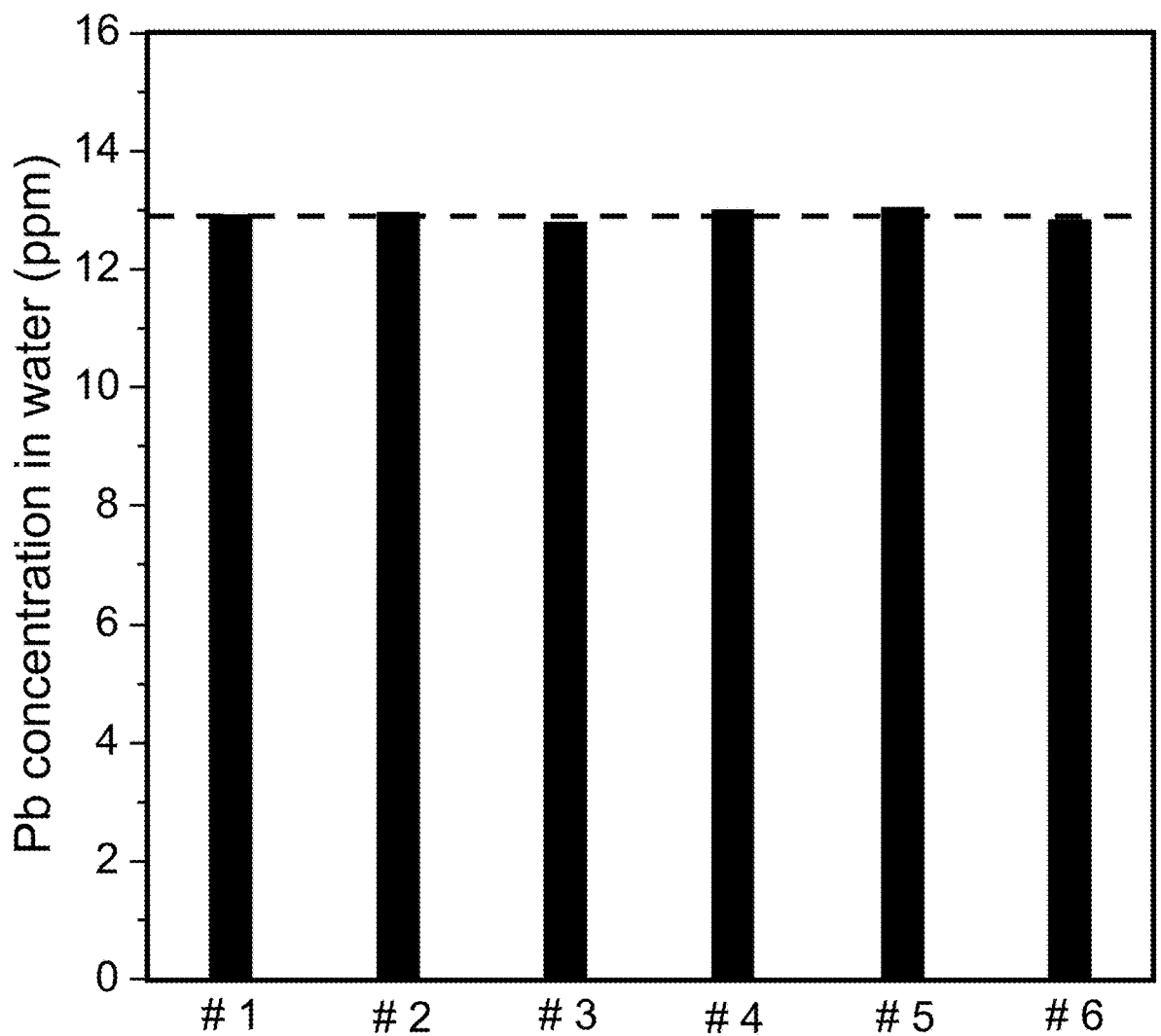
FIG. 8A illustrates lead concentrations released from devices (six total) damaged on both sides, without any lead-sequestering materials after being immersed in 40 mL water for 3 hours. The concentrations of dissolved lead from these devices were slightly higher than the calculated values based on the density and thickness of the perovskite layers due to the slightly excessive amount of PbI$_2$ used in the precursor solutions.
Figure 8B:
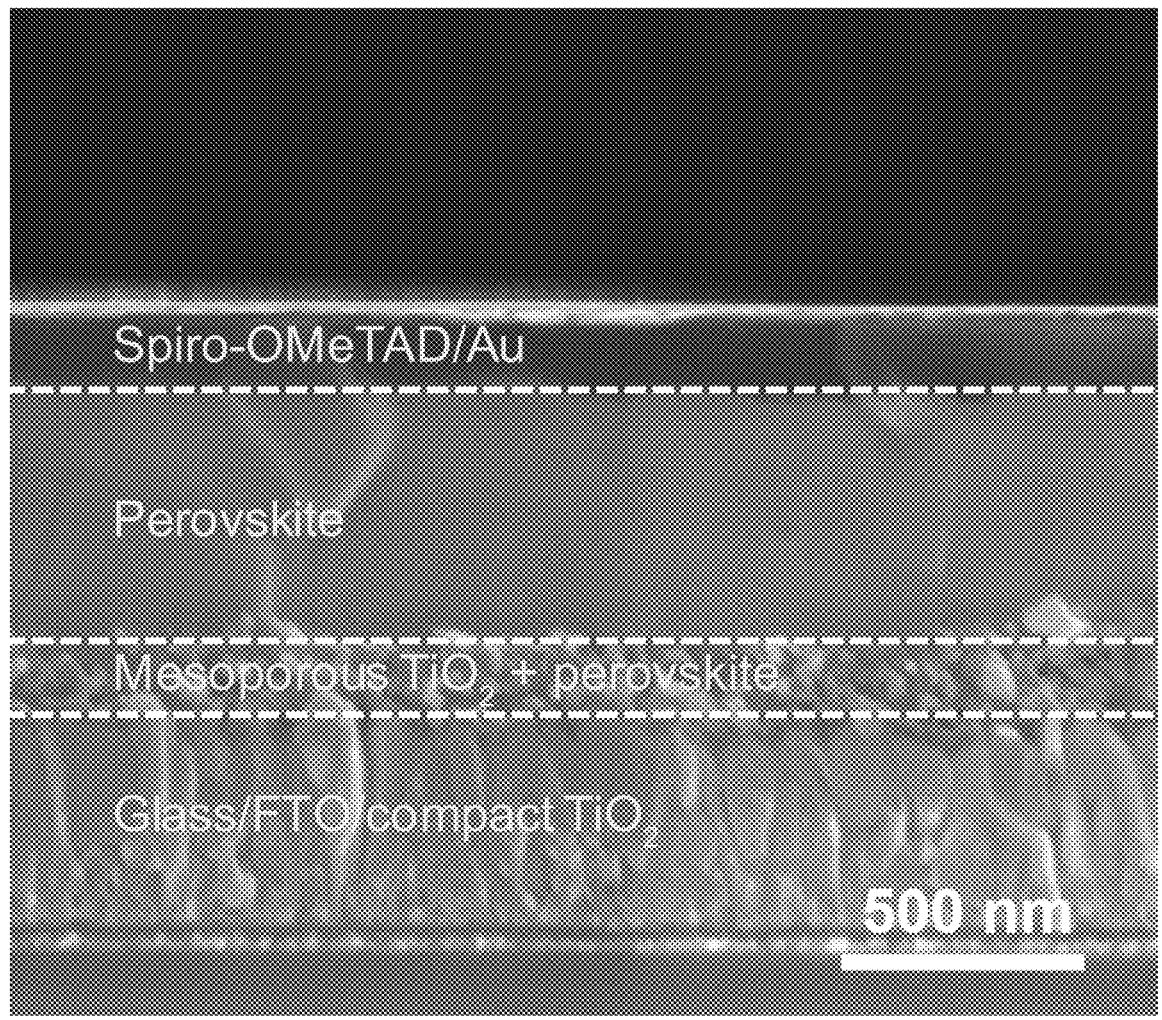
FIG. 8B illustrates the device architecture of a perovskite-containing solar cell that was tested without the presence of layers of lead-sequestering materials.
Figure 9:
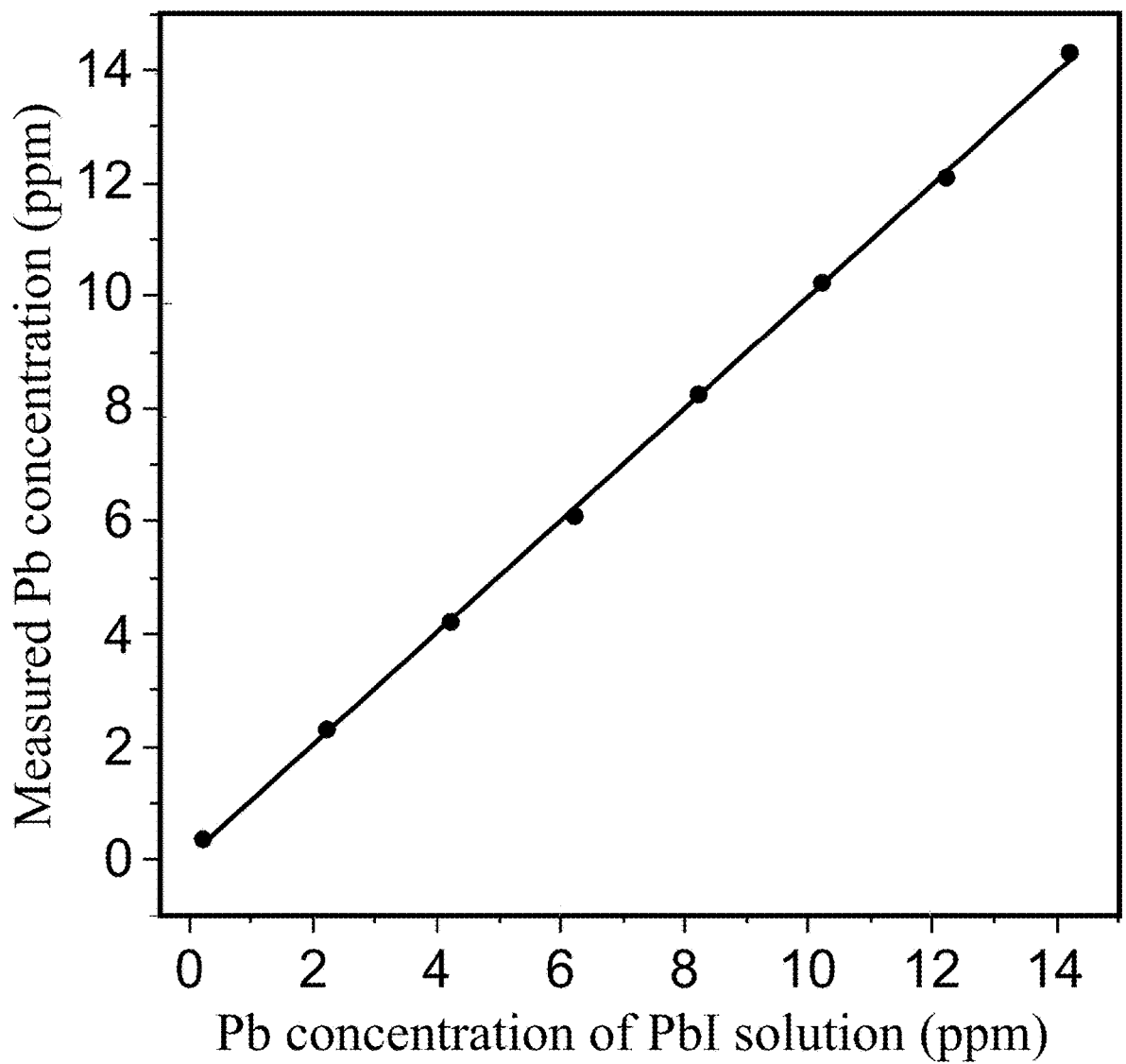
FIG. 9 illustrates a verification curve of prepared lead concentrations of various PbI$_2$ solutions and the measured concentrations by flame atomic absorption spectrometer (FAAS). The result shows excellent accuracy and precision of the measurement system.

The lead-sequestering capability of the DMDP-containing and EDTMP-PEO-containing layers were first evaluated by immersing the individual layers in $PbI_2$ aqueous solutions and studying the time-dependent $Pb^{2+}$ content in the solutions. The release of lead from six pristine control PSCs were used as a reference to verify that the accuracy of the measurements was within a satisfactory range. FIG. 8A illustrates the amounts of lead released from these perovskite-containing devices having the cell architecture shown in FIG. 8B. The dashed horizontal line in FIG. 8A corresponds to the calculated lead concentration expected as a result of the perovskite layer's density and film thickness. FIG. 9 illustrates a verification curve of lead concentrations in water as measured by FAAS, which illustrates that the method for measuring lead to generate lead concentration data reported herein is extremely accurate and precise. (The linear curve fit is y=0.99299x with an $R^2$=0.99957.)

Figure 10:
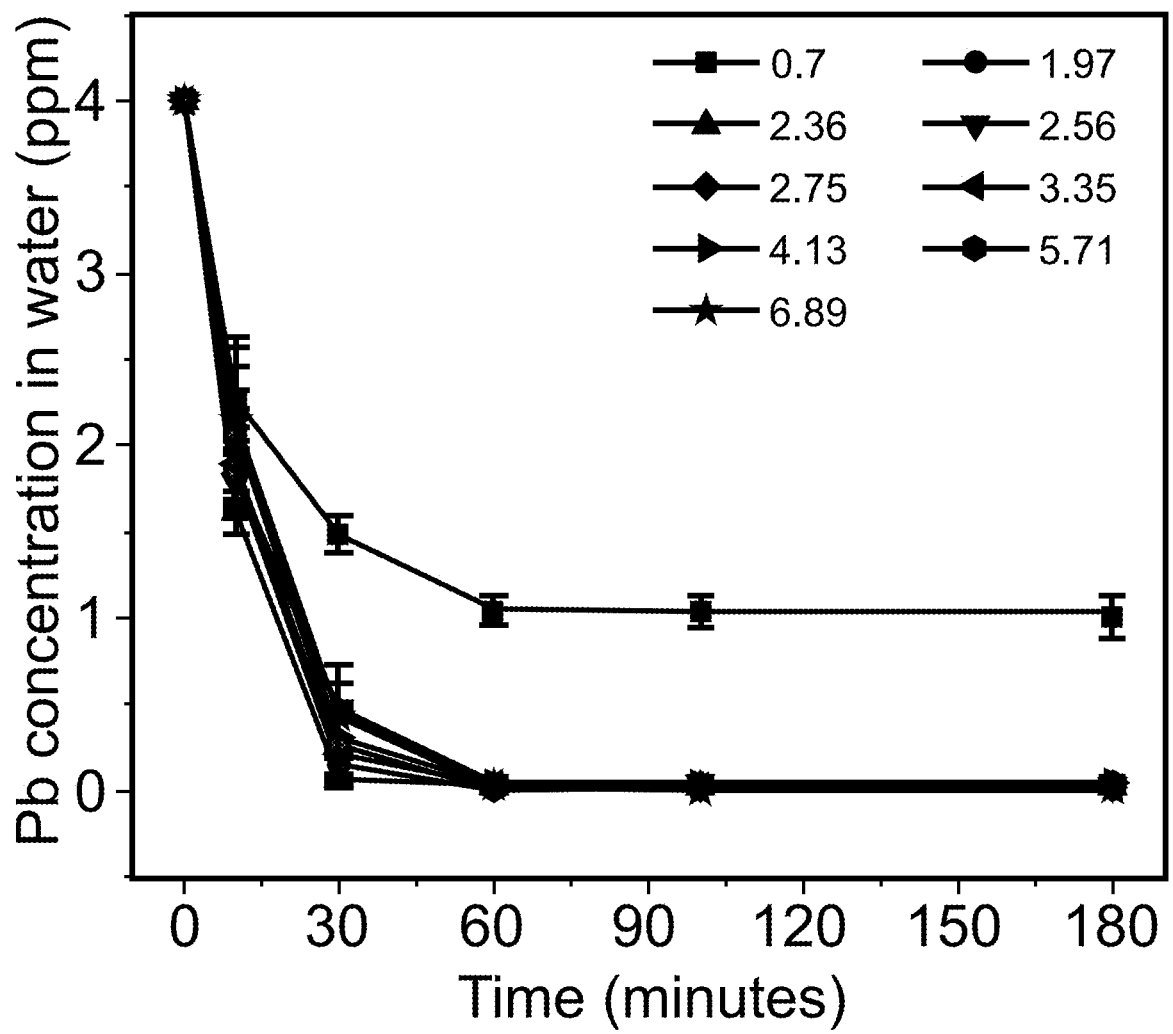
FIG. 10 illustrates the lead-sequestering performance as a function of immersion time for DMDP layers coated on glass substrates with different thicknesses, according to some embodiments of the present disclosure. The DMDP layer thicknesses are indicated in micrometers. All of the DMDP coated glass substrates were immersed in 50 mL of a $1.93 \times 10^{-5}$ M PbI$_2$ aqueous solution (equivalent to a total of $9.65 \times 10^{-7}$ mol Pb$^{2+}$ or 4 ppm of Pb$^{2+}$, while the maximum solubility of PbI$_2$ in 50 ml water is about $8.20 \times 10^{-5}$ mol at room temperature) to test the lead-sequestering capabilities of these samples.

FIG. 10 shows the temporal $Pb^{2+}$ concentration profiles of 50 ml of $1.93 \times 10^{-5}$ M $PbI_2$ aqueous solutions (equivalent to 4 ppm of $Pb^{2+}$ and a total of $9.65 \times 10^{-7}$ mol $Pb^{2+}$, note that the maximum solubility of $PbI_2$ in 50 ml water is $8.20 \times 10^{-5}$ mol at room temperature) upon adding 4 cm² DMDP films with different thicknesses (i.e. different amounts of DMDP molecules). In general, a 1.97-μm-thick DMDP film contains the DMDP molecule equivalent of 2.1 times of the amount of $Pb^{2+}$ in the aqueous solution; thicker DMDP films provide more absorption capacity. The $1.93 \times 10^{-5}$ M $PbI_2$ (4 ppm $Pb^{2+}$) was selected because the average annual rain precipitation is 77 cm in the U.S., which corresponds to about 300 mL water for a 4 cm²-area. Thus, if the amount of Pb within the 4-cm²-device were dissolved by the rainwater (~300 mL), the Pb concentration would be $4.84 \times 10^{-6}$ M (1 ppm $Pb^{2+}$). Hence, the use of the 50 mL $1.93 \times 10^{-5}$ M (4 ppm $Pb^{2+}$) $PbI_2$ solution was intended to intentionally worsen the scenario by a factor of about 4 to test the Pb-absorption capability of the DMDP film in this extreme condition. FIG. 10 illustrates no significant difference in the $Pb^{2+}$ sequestering capability for DMDP layers having different thicknesses (e.g. between 1.97 μm and 6.89 μm) that already contain excess DMDP with respect to the amount of $Pb^{2+}$ in solution. All thicker DMDP layers were capable of depleting $Pb^{2+}$ concentration to the lowest detection limit (0.08 ppm) of the analytic method used (atomic absorption spectroscopy) within 60 minutes. In contrast, the 0.7-μm-thick DMDP layer (equivalent to ~75% of the amount of $Pb^{2+}$ in solution) showed limited effect due to the lack of sufficient binding sites. Therefore, considering the optical and cost-effectiveness, a DMDP layer having a thickness of about 2.36 μm was selected for further studies, as disclosed herein.

Using the method described above, a comparison was completed of the Pb-sequestering capabilities of EDTMP-PEO and EDTMP-PVA layers, when immersed in $PbI_2$ solutions (50 mL of $3.4 \times 10^{-5}$ mol/L, equivalent to 7 ppm). Both sequestering film compositions contained the same molar amount of EDTMP, $\sim 2.3 \times 10^{-5}$ mol/cm², equivalent to $9.2 \times 10^{-5}$ mol for a 4-cm² film sample, which equates to a theoretical lead-sequestering capacity that was approximately 55 times the amount of $Pb^{2+}$ contained in the $PbI_2$ solutions in which the films were immersed. As discussed above, FIG. 4 illustrates that the EDTMP-PEO layer (containing $2.3 \times 10^{-5}$ mol/cm² EDTMP) prepared by dissolving PEO in ACN provided the best results, which will be discussed further below.

Figure 11A:
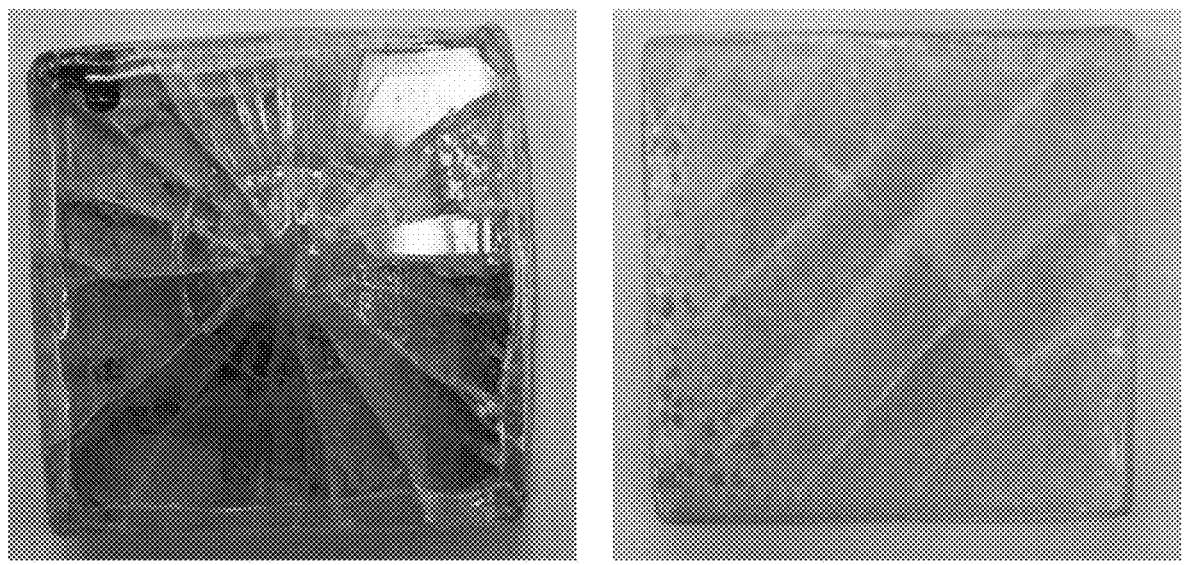
FIG. 11A illustrates of photographs PSCs damaged as described herein.
Figure 11B:
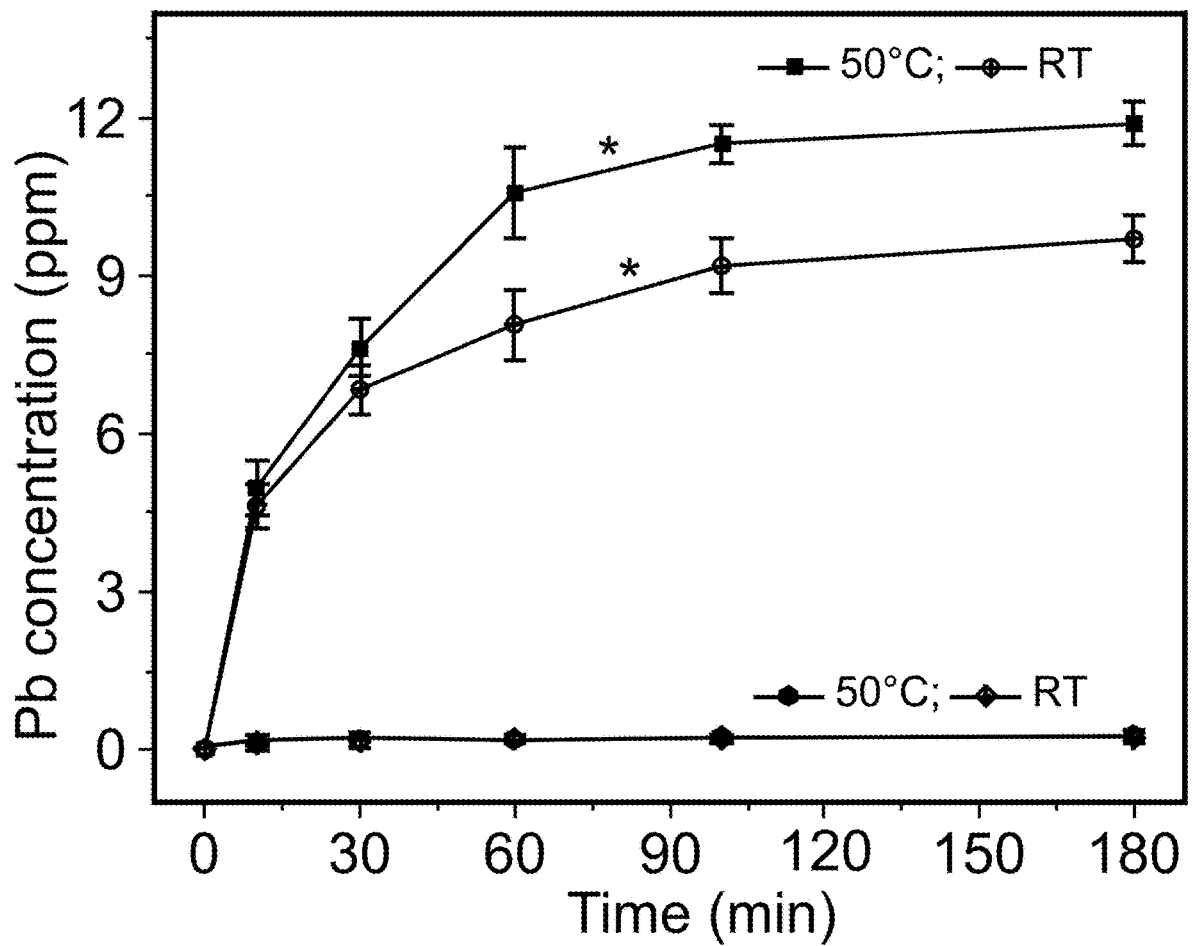
FIG. 11B summarizes the amount of lead released from the damaged devices shown in FIG. 11A.

The lead-sequestering layers described above were integrated with PSCs to investigate their effects on the resultant devices' ability to sequester the lead contained in the perovskite layers of the PSCs. A 2.36 μm thick DMDP lead-sequestering layer and a 0.45 mm thick EDTMP-PEO sequestering layer (containing $2.3 \times 10^{-5}$ mol/cm² EDTMP) were positioned on the glass side and the metal electrode side of PSCs (total perovskite covered area is 2.5 cm×2.5 cm), respectively, while identical devices absent any lead-sequestering material were prepared for comparison. All of the devices included an EVA layer applied to seal the metal electrode side of the PSCs. A catastrophic failure of each of the devices was simulated by mechanically shattering the glass side (see the photograph on the left in FIG. 11A), followed by cutting the EVA layer and underlying layers of the metal electrode (see the photograph on the right in FIG. 11A). The resultant damaged devices were each immersed in 40 mL of pure water to determine the lead-sequestering capabilities of the DMDP and EDTMP-PEO sequestering materials. FIG. 11B illustrates the time-dependent lead concentrations that resulted from the immersion of the damaged devices containing the lead-sequestering layers immersed in water, compared to the control devices (not containing DMDP and/or EDTMP-PEO), measured at two temperatures, both room temperature and 50° C. (to mimic summer temperatures). The devices lacking lead-sequestering layers are indicated with asterisks.

Figure 11C:
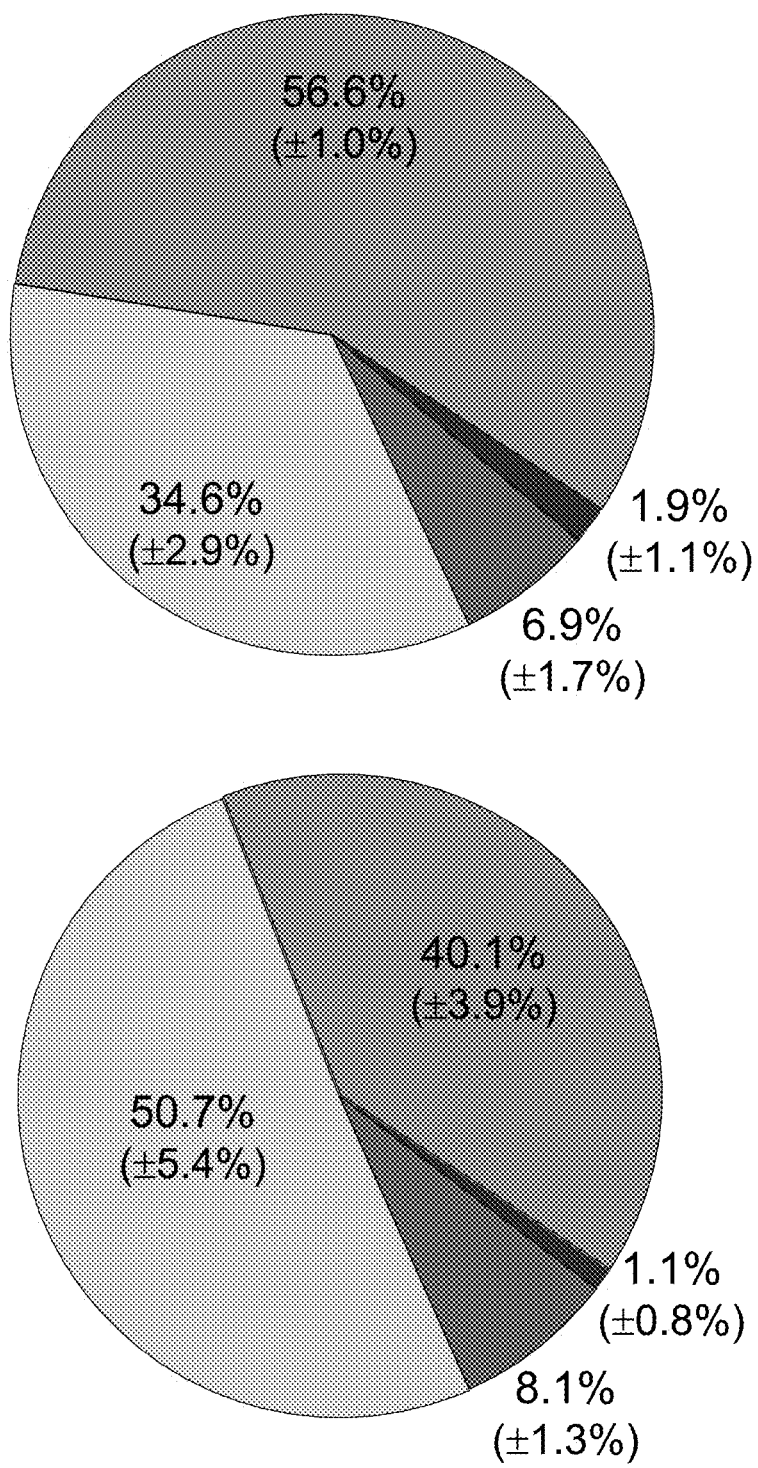
FIG. 11C illustrates the final distribution of lead at various possible locations in the damaged devices and to the local environment (water), for the damaged devices shown in FIG. 11A. These data are summarized in Table 2 below.

Notably, the damaged devices containing the lead-sequestering materials, demonstrated lead loss values that remained about 0.2 ppm for both room temperature and 50° C., while immersed in water. These results suggest that the sequestering materials, compositions, and/or molecules (e.g. lead-sequestering layers) described herein can be utilized to effectively sequester various toxic elements and/or molecules, for example lead ions released from lead-containing perovskite layers contained in PSCs. To further track the release of lead, the lead amounts remaining in the lead-sequestering layers and in the devices as a whole were measured, after 3 hours immersed in water. As shown FIG. 11C, with the lead-sequestering layers installed on both sides of the device, less than 2% of the lead from the perovskite layer were released into the water, for both the room temperature and 50° C. temperature tests. The top pie-chart is for data collected at 50° C. and the bottom pie-chart is for data collected at room temperature. Table 2 below summarizes the data shown in FIG. 11C.

TABLE 2

| Pb location | 50° C. (%) | RT (%) |
|---|---|---|
| In water | 1.9 ± 1.1 | 1.1 ± 0.8 |
| In device | 6.9 ± 1.7 | 8.1 ± 1.3 |
| In DMDP | 34.6 ± 2.9 | 50.7 ± 5.4 |
| In EDTMP-PEO | 56.6 ± 1.0 | 40.1 ± 3.9 |

Figure 12:
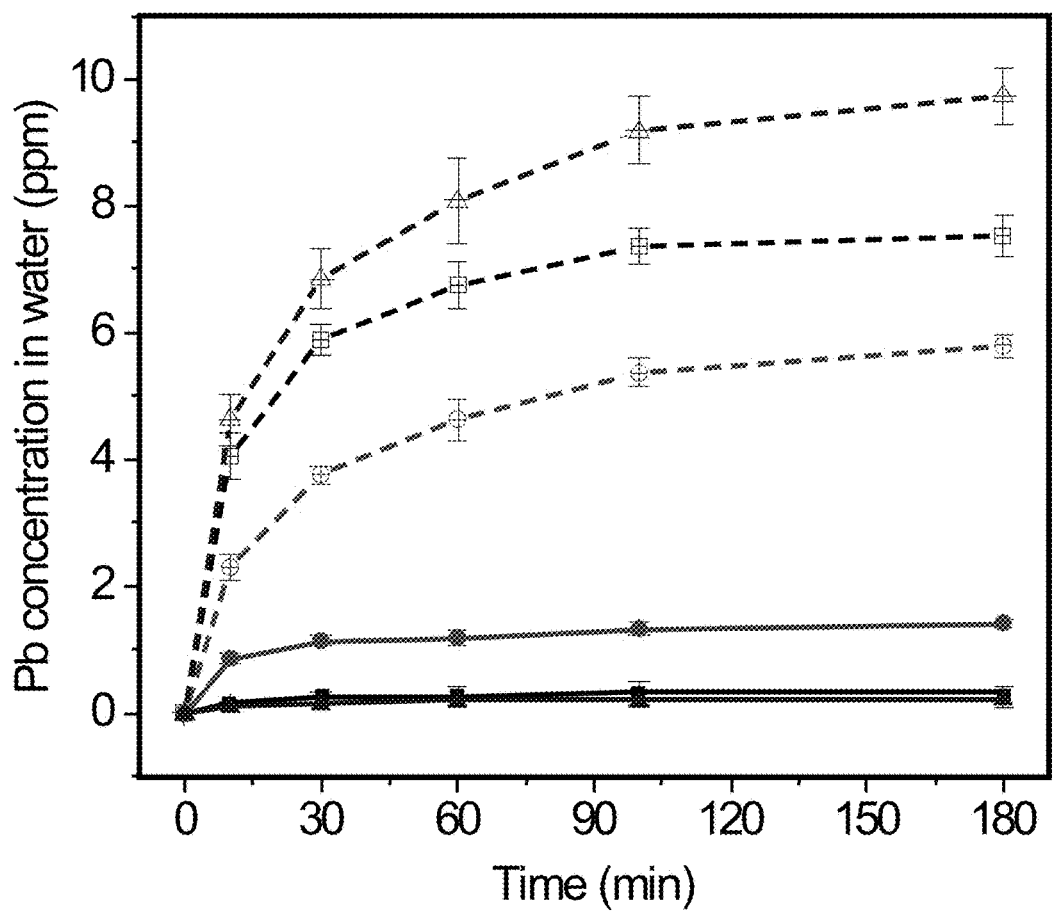
FIG. 12 illustrates the effect on the lead-sequestration abilities of damaged devices at room temperature, according to some embodiments of the present disclosure. The table provides a legend for each data set illustrated in the top figure.

FIG. 12 illustrates the effect on the lead-sequestration abilities of damaged devices at room temperature, according to some embodiments of the present disclosure. The temporal lead concentrations of three control devices (only sealed by EVA film on the metal electrode side) and three devices including one installed with DMDP film on the glass side alone (and the metal side is sealed with EVA), one installed with EDTMP-PEO on the metal side alone (sealed by EVA) and one with both DMDP film on glass side and EDTMP-PEO film on metal side (sealed by EVA film), according to some embodiments of the present disclosure. All these devices contained identical perovskite compositions, thicknesses, and areas. After intentionally damaging these devices as described herein, lead release tests were conducted at room temperature by immersing the damaged devices in 40 mL of pure water.

Figure 13:
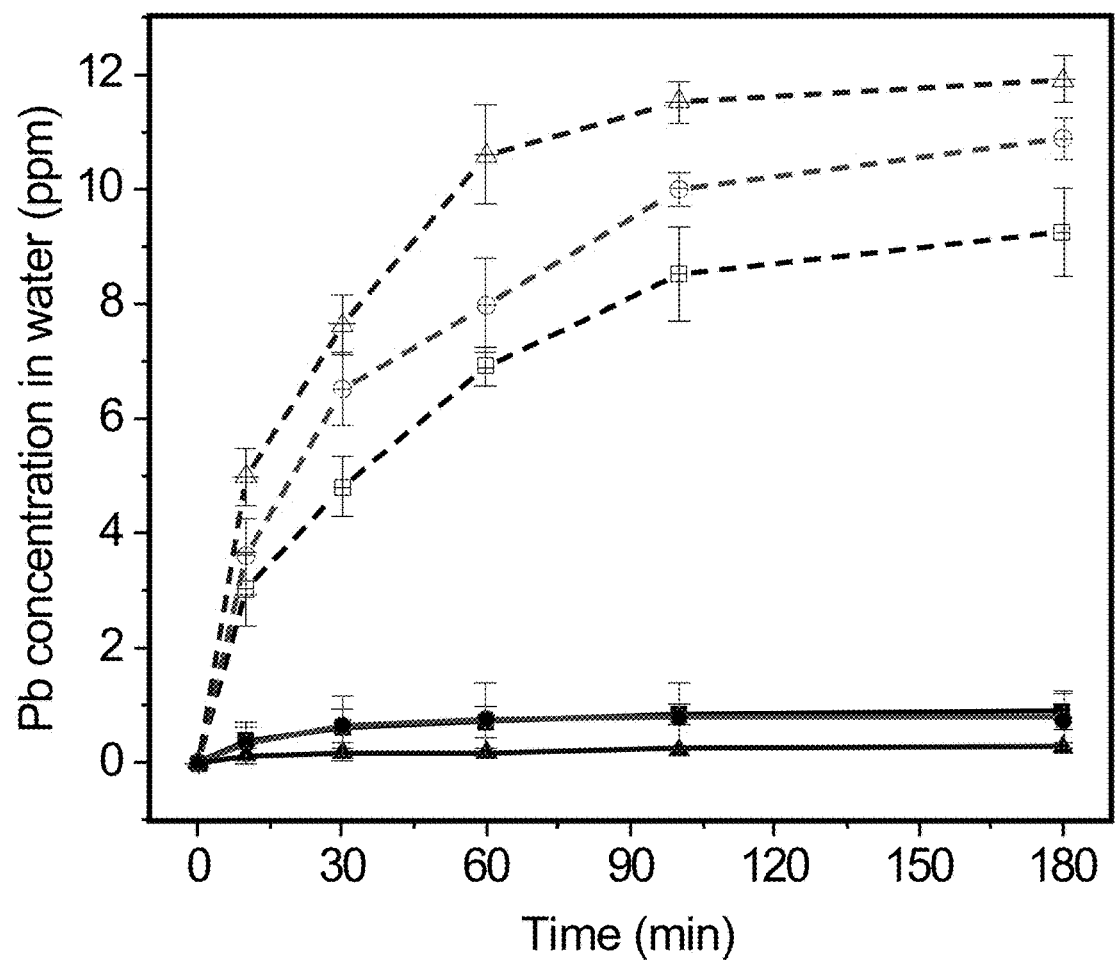
FIG. 13 illustrates the effect on the lead-sequestration abilities of damaged devices at 50° C., according to some embodiments of the present disclosure. The table provides a legend for each data set illustrated in the top figure.

FIG. 13 illustrates the effect on the lead-sequestration abilities of damaged devices at 50° C., according to some embodiments of the present disclosure. The temporal lead concentrations of three control devices (only sealed by EVA film on the metal side) and three devices including one installed with DMDP film on the glass side alone (and the metal side is sealed with EVA), one installed with EDTMP-PEO on the metal side alone (sealed by EVA) and one with both DMDP film on glass side and EDTMP-PEO film on metal side (sealed by EVA film). All these devices contained identical perovskite, compositions, thicknesses, and areas.

Figure 14:
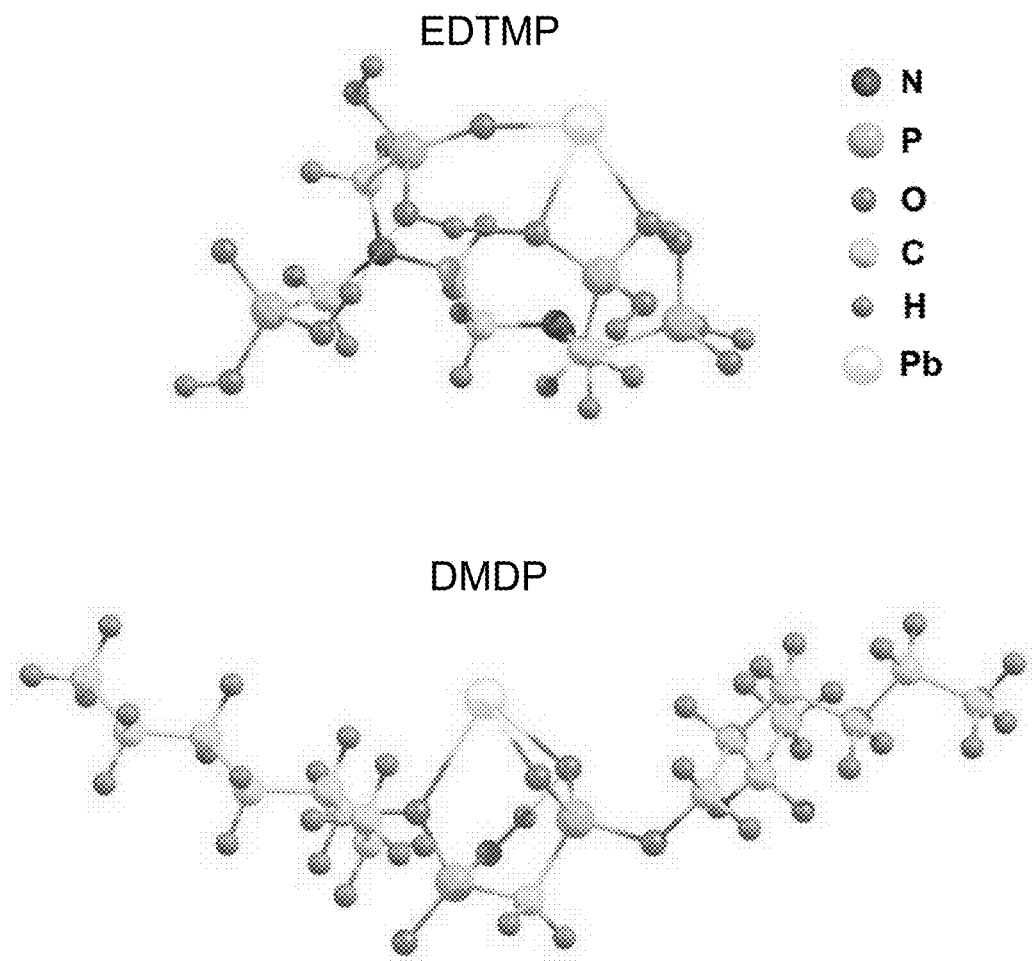
FIG. 14 illustrates molecular modeling results of the binding configurations of $Pb^{2+}$ ions with deprotonated DMDP and EDTMP, according to some embodiments of the present disclosure. Configurations were obtained based on density functional theory calculations.

After intentionally damaging these devices as described herein, lead release tests were conducted at 50° C. by immersing the damaged devices in 40 mL of pure water. FIG. 14 illustrates molecular modeling results of the binding configurations of $Pb^{2+}$ ions with deprotonated DMDP and EDTMP. Configurations were obtained based on density functional theory calculations.

Figure 15A:
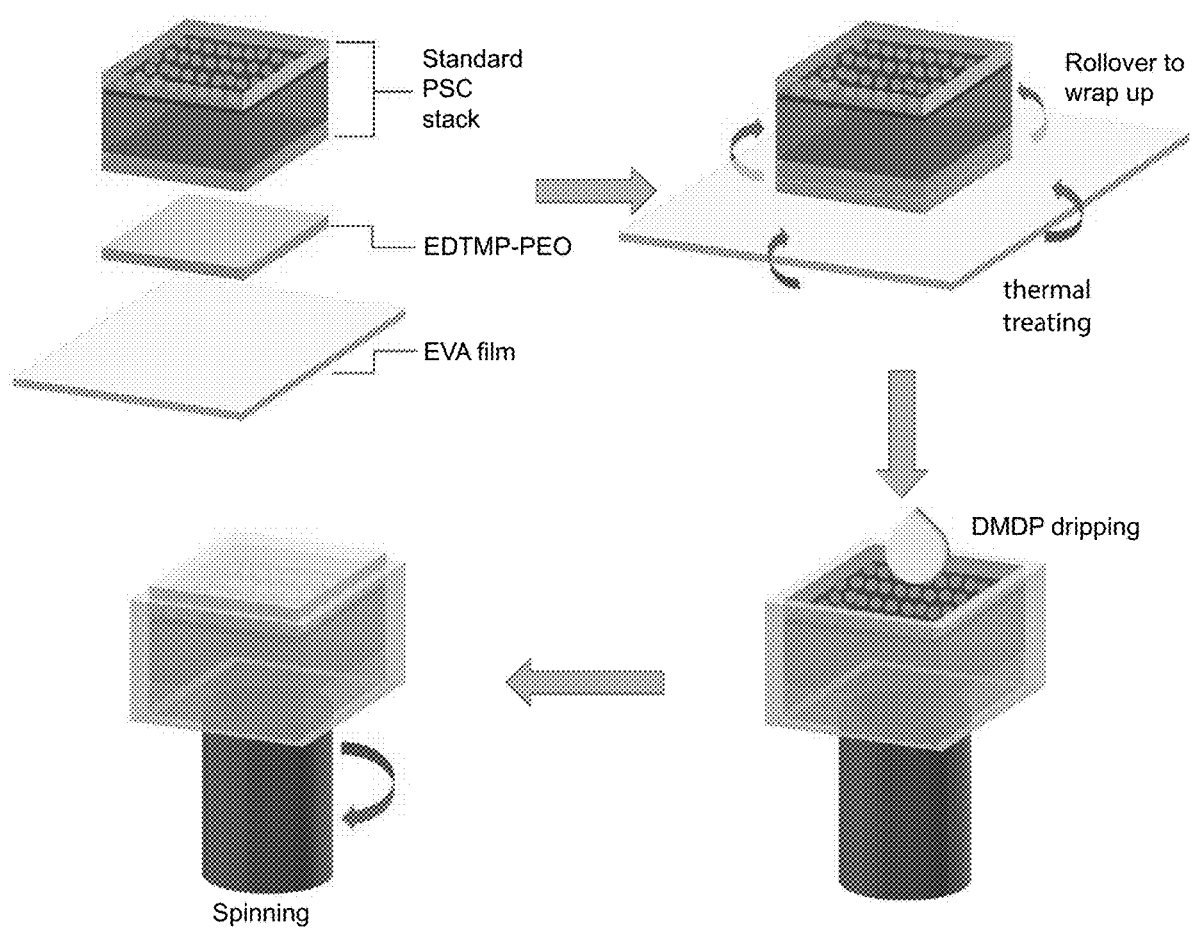
FIG. 15A illustrates a schematic of a method for producing perovskite-containing solar cells that include layers of sequestering materials, according to some embodiments of the present disclosure.
Figure 15B:
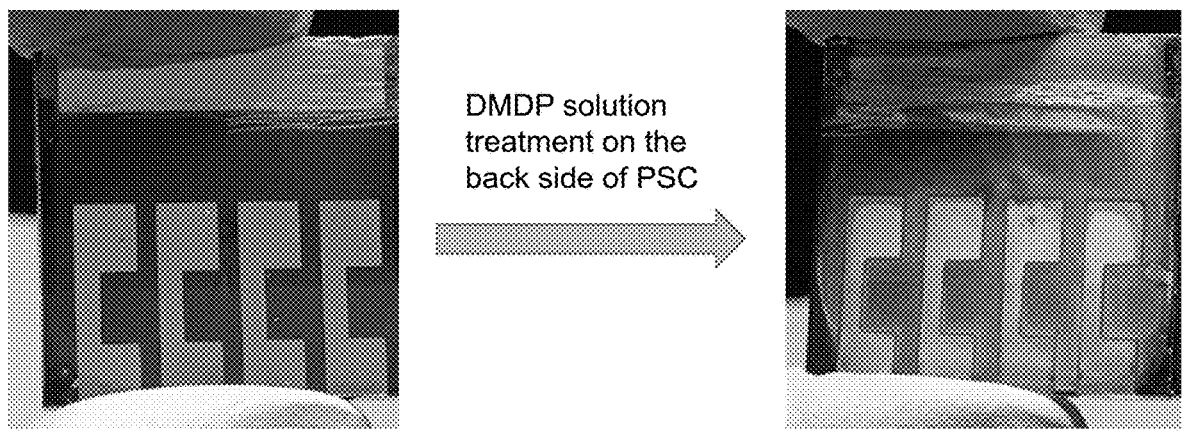
FIG. 15B compares a pristine device (left) and a device treated with the DMDP solution (right) showing that directly applying the DMDP in ethanol solution damaged the perovskite stack, with the damage indicated by the yellowing associated with perovskite decomposition due to the polar ethanol.

FIG. 15A illustrates a schematic of a method for producing perovskite-containing solar cells that include layers of sequestering materials, according to some embodiments of the present disclosure. In this exemplary method, the metal side of the PSC stack was positioned adjacent to a Pb-sequestrating EDTMP-PEO film, such that the Pb-sequestrating EDTMP-PEO film was positioned between the metal side and an EVA packaging layer (i.e. EVA film). The EVA film was softened to seal the edges of the device stack, by heat treatment, and the extra EVA on the edges were cut off to be flush with the glass surface. The EDTMP-PEO films were made by blending PEO with EDTMP. Briefly, PEO was dissolved in ACN at a concentration of 10 wt %; the resultant gel-like PEO solution was physically mixed with EDTMP fine powder under vigorous mechanical stirring. The resulting opaque mixture was doctor-bladed on a plastic plate, followed by desiccation, to form a PEO film containing 0.01 g/cm$^2$ of EDTMP, denoted as EDTPM-PEO film, which was subsequently peeled off and cut into the same area as the perovskite layer and sandwiched between the metal electrodes and EVA film. The thickness (~0.45 mm) of the dried EDTMP-PEO film was determined by a micrometer. Thereafter, the devices were spin-coated with DMDP solution on the glass side. FIG. 15B compares a pristine device (left) and a device treated with the DMDP solution (right) showing that directly applying the DMDP in ethanol solution damaged the perovskite stack, as made evident by the yellowing associated with perovskite decomposition due to exposure to the polar ethanol.

Figure 16A:
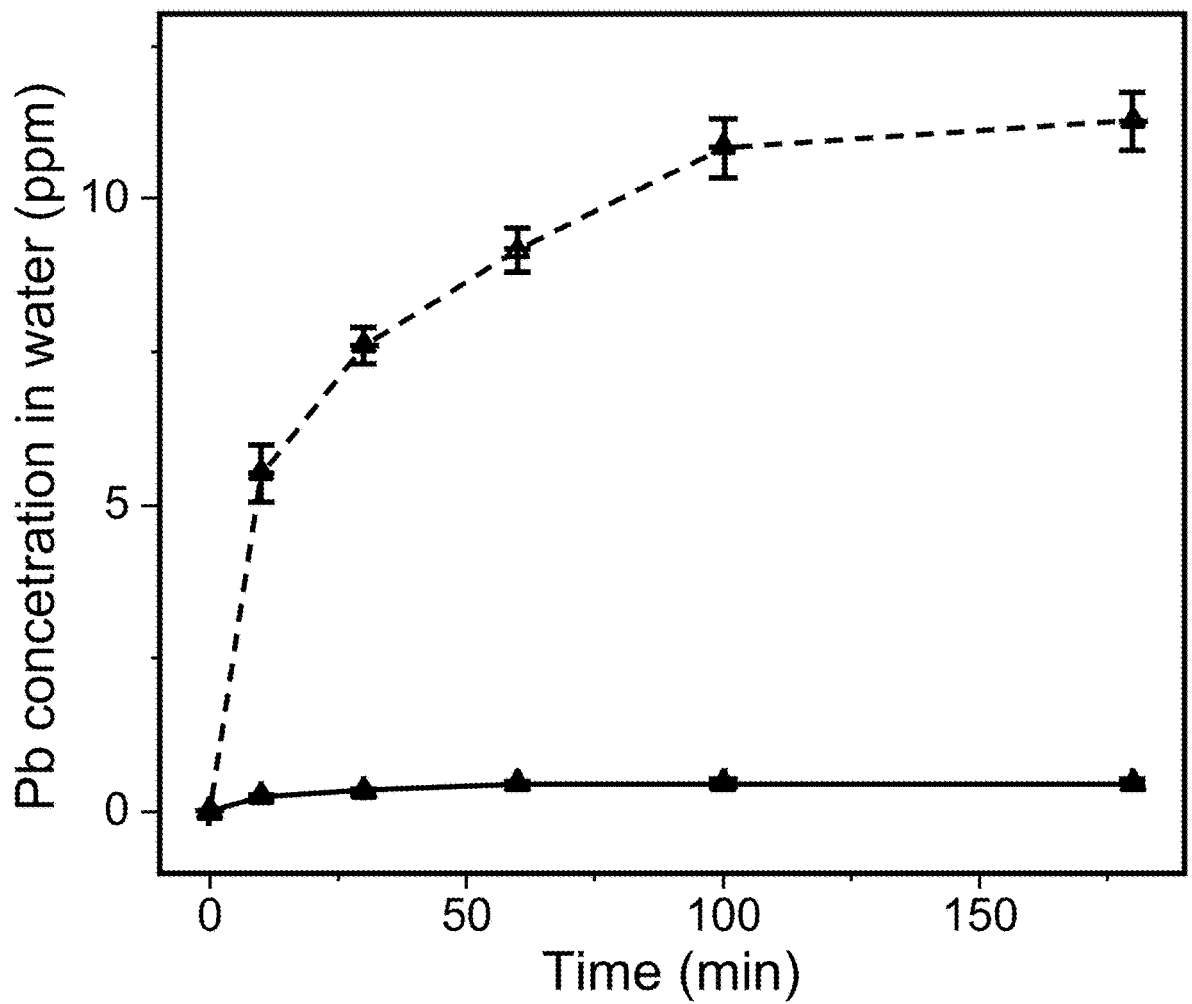
FIG. 16A illustrates lead leakage from devices in acidic water at room temperature, according to some embodiments of the present disclosure.

FIG. 16A illustrates Pb leakage from devices in acidic water at room temperature, according to some embodiments of the present disclosure. The effect of Pb sequestering material on Pb leakage from the devices as a function of soaking time of damaged PSCs immersed in acidic water (pH=4.2) was examined at room temperature. The samples without any Pb sequestering material (data set with hollow triangular markers) were used as the control. The samples with Pb sequestering material (data set with solid triangular markers) had both sides of device stack coated with Pb-sequestrating films: DMDP film on glass side and EDTMP-PEO film on metal side. All samples were covered by EVA film on the metal electrode side. For all samples, both sides of the device stack were damaged in the same manner and soaked in 40 mL of water (pH=4.2). Three devices for each type of sample were measured with the averages and standard deviations indicated. The sequestration efficiency (SQE) is calculated for devices with Pb-sequestering materials installed on both sides of the device, and is defined by, $$SQE (\%) = \left(1 - \frac{Pb \text{ leakage from devices with } Pb \text{ absorbers on both sides}}{Pb \text{ leakage from devices without } Pb \text{ absorbers}}\right) \times 100\%.$$

The lead SQE after a 3-hour soaking test in acidic water is averaged about 96.1% at room temperature.

Figure 16B:
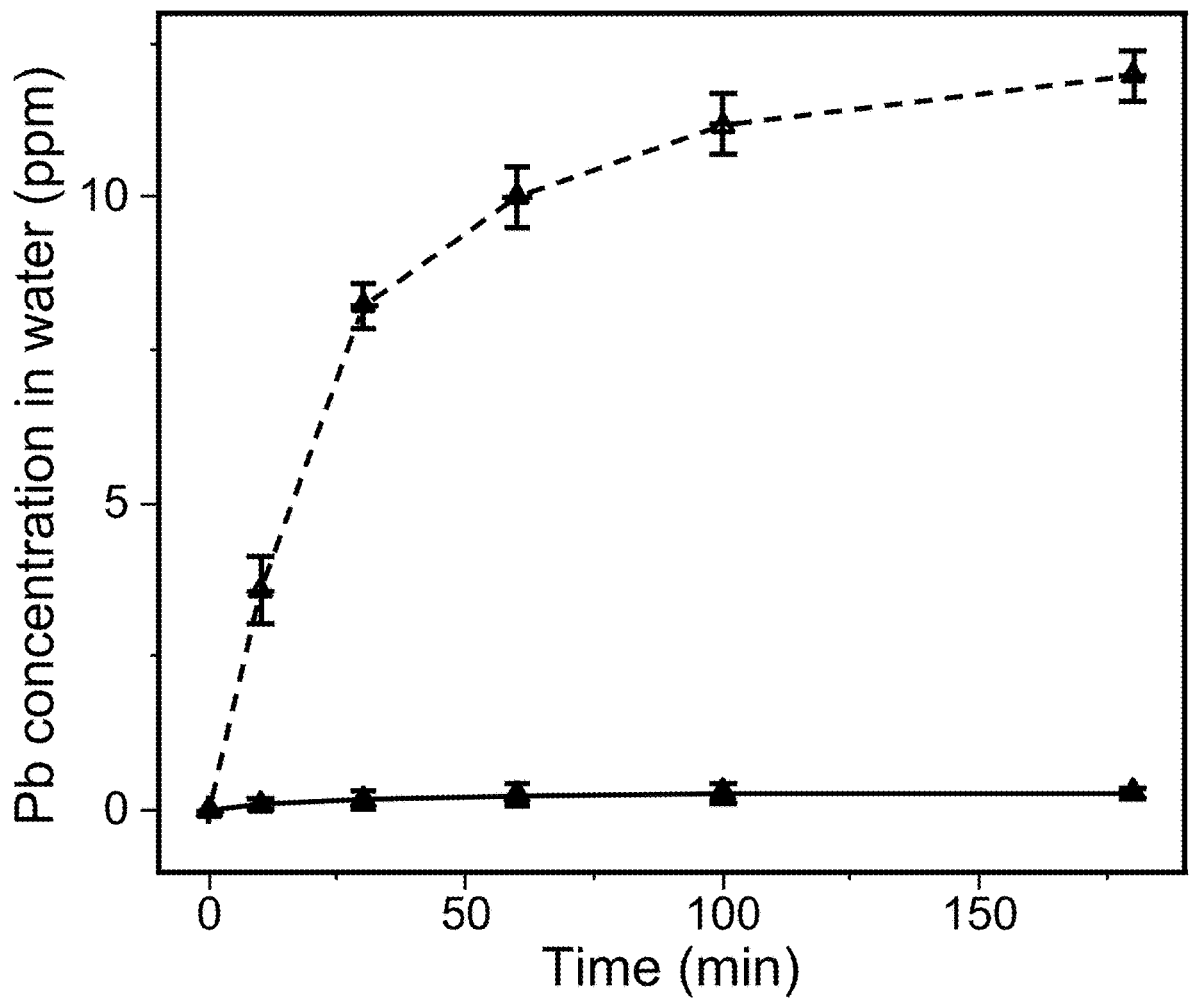
FIG. 16B illustrates lead leakage from devices in acidic water at 50° C., according to some embodiments of the present disclosure.

FIG. 16B illustrates Pb leakage from devices in acidic water at 50° C., according to some embodiments of the present disclosure. The effect of Pb sequestering materials on Pb leakage as a function of soaking time of damaged PSCs immersed in acidic water (pH=4.2) was examined at 50° C. The samples without any Pb sequestering material (hollow markers) were used as the control. The samples with Pb sequestering material (solid markers) had both sides of device stack coated with Pb-sequestrating films: DMDP film on glass side and EDTMP-PEO film on metal side. All samples were covered by EVA film on the metal electrode side. For all samples, both sides of the device stack were damaged in the same manner and soaked in 40 mL of water (pH=4.2). Three devices for each type of sample were measured with the averages and standard deviations indicated. The acidic water test is to mimic the acidic rain condition. The lead SQE after a 3-hour soaking test in acidic water is averaged about 97.7% at 50° C., and the SQE was not affected by the pH values of typical acidic rains.

Figure 16C:
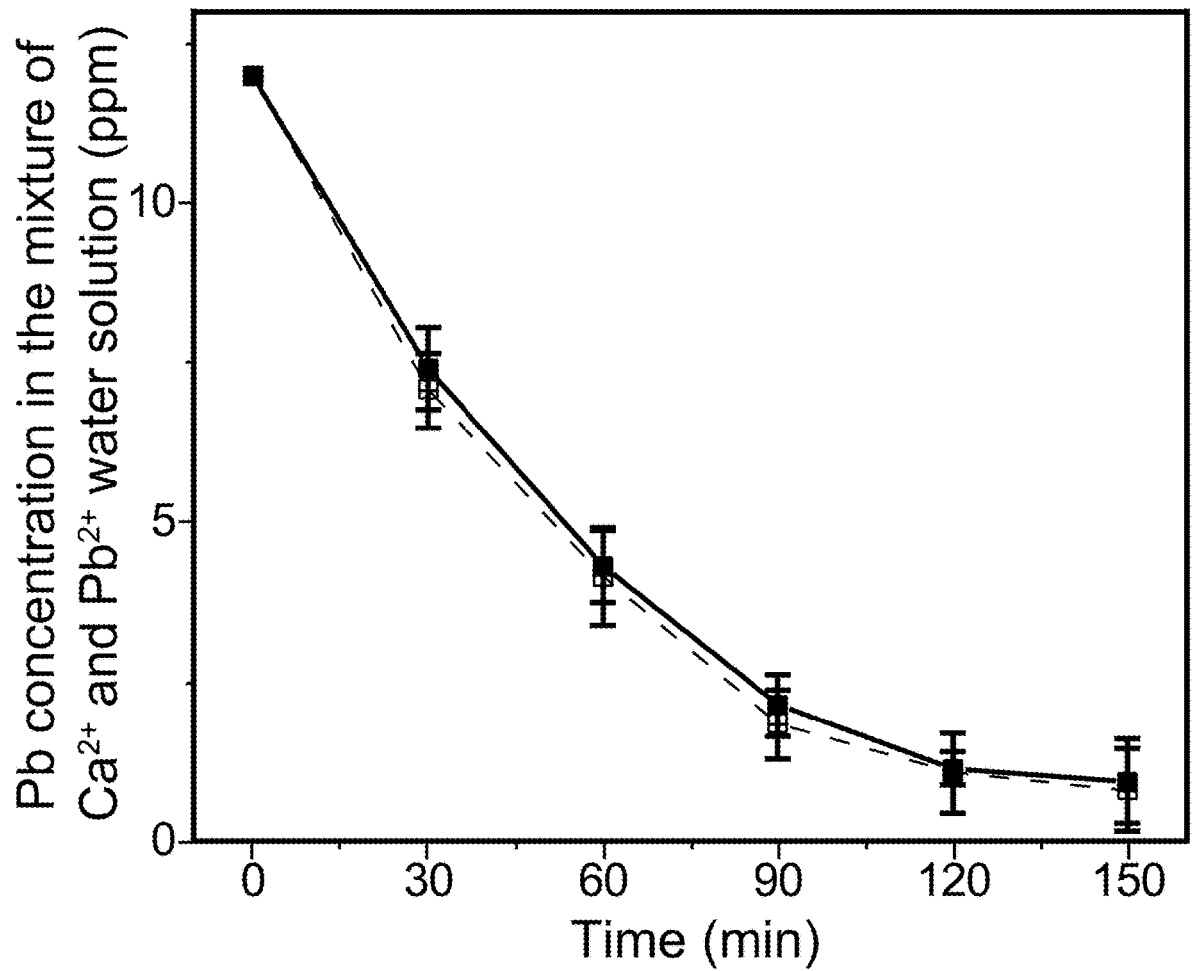
FIG. 16C illustrates the impact of competitive ion ($Ca^{2+}$) on lead sequestration by DMDP, according to some embodiments of the present disclosure.

FIG. 16C illustrates the impact of calcium ions ($Ca^{2+}$) on lead sequestration by DMDP, according to some embodiments of the present disclosure. The influence of $Ca^{2+}$ ions (from $CaCl_2$) competing with lead for sequestration was studied by soaking the DMDP samples in identical plastic beakers, each of which contains 40 mL of water containing 12 ppm $Pb^{2+}$ and 0.1 ppm $Ca^{2+}$ at room temperature (data set with solid square markers). For the control tests, the water solution only contained $Pb^{2+}$ ions (data set with hollow square markers). Three devices for each type of test conditions were measured with the averages and standard deviations indicated. $Ca^{2+}$ is a possible divalent cation in rainfall, which may affect the SQE of the sequestration materials. However, no obvious negative effects of the competitive ion ($Ca^{2+}$) on lead sequestration by the Pb-sequestration materials used in this test were observed.

Figure 16D:
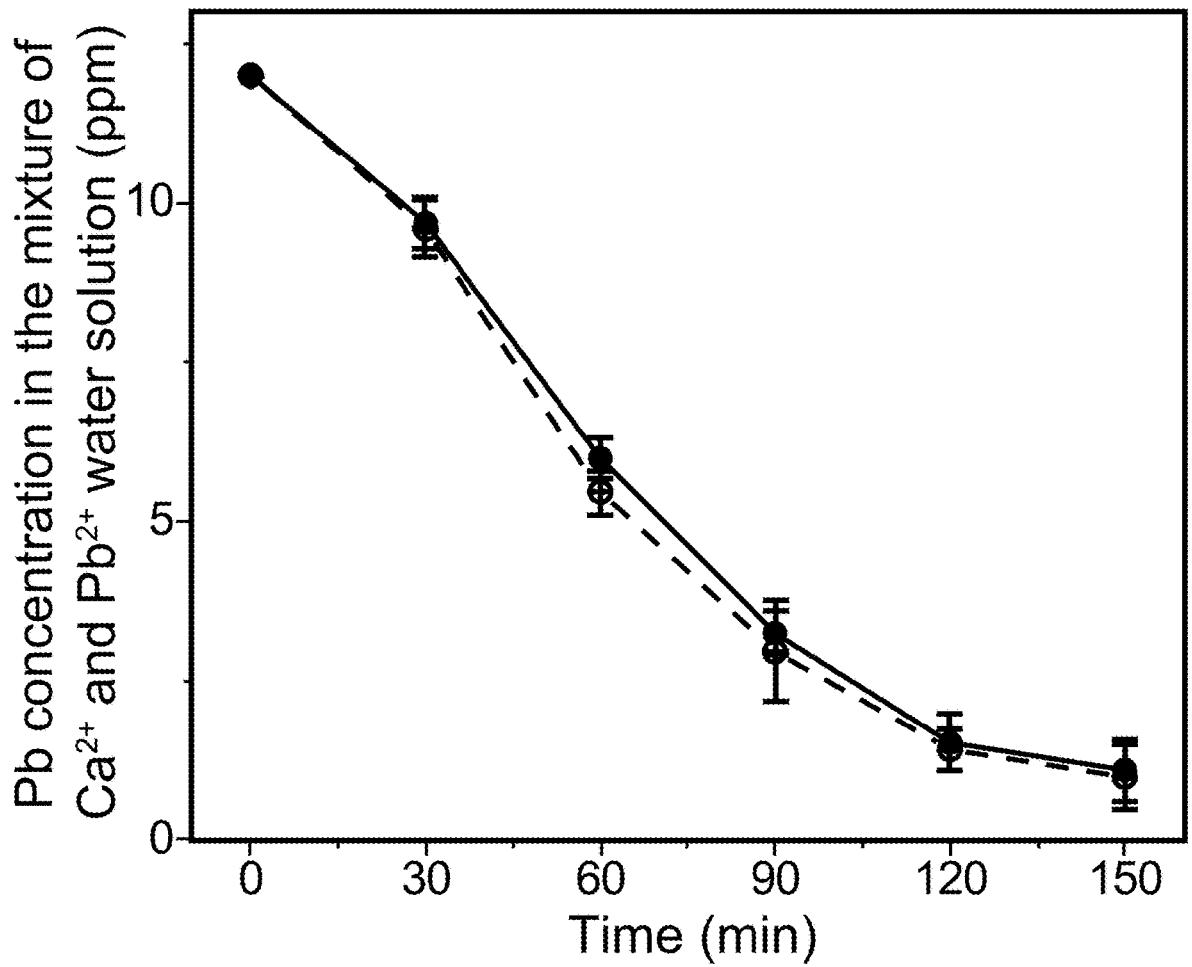
FIG. 16D illustrates the impact of competitive ion ($Ca^{2+}$) on lead sequestration by EDTMP-PEO, according to some embodiments of the present disclosure.

FIG. 16D illustrates the impact calcium ions ($Ca^{2+}$) on Pb sequestration by EDTMP-PEO, according to some embodiments of the present disclosure. The influence of $Ca^{2+}$ (from $CaCl_2$) ions competing with lead for sequestration was studied by soaking the EDTMP-PEO samples in identical plastic beakers, each of which contains 40 mL of water containing 12 ppm $Pb^{2+}$ and 0.1 ppm $Ca^{2+}$ at room temperature (data set with solid circular markers). For the control tests, the water solution only contained $Pb^{2+}$ ions (data set with hollow circular markers). Three devices for each type of test conditions were measured with the averages and standard deviations indicated. No obvious negative effect of the competitive ion ($Ca^{2+}$) on lead sequestration is observed.

Figure 16E:
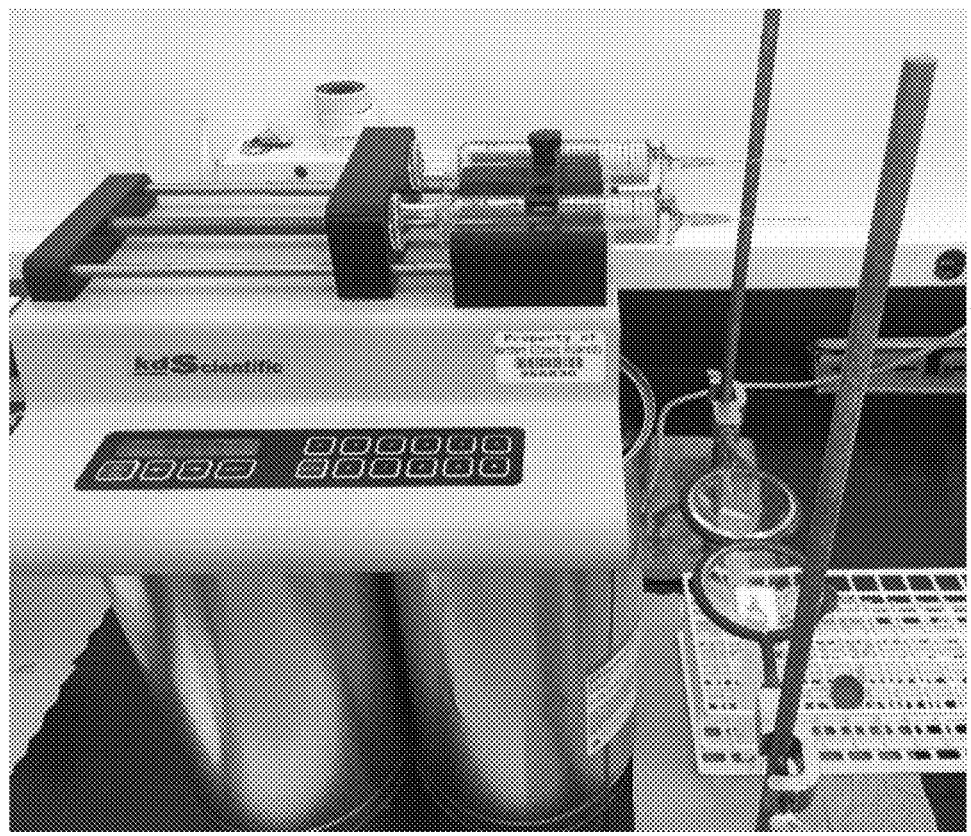
FIG. 16E illustrates a photograph of custom-made apparatus to study lead leakage from damaged devices under flowing water to simulate a raining condition, according to some embodiments of the present disclosure.

FIG. 16E illustrates a photograph of custom-made apparatus to study lead leakage from damaged devices under flowing water to simulate a raining condition, according to some embodiments of the present disclosure. The flowing water was continuously dripped on the damaged devices at a rate of 5 mL per hour for 1.5 hour facilitated by a syringe pump. The damaged devices were placed in the funnel with a tilt angle of approximate 30° versus horizon. The rinsed water that contained lead was collected in plastic tubes. Flow water mimiced the dynamic rainfall motion of real, in the field, scenarios.

Figure 16F:
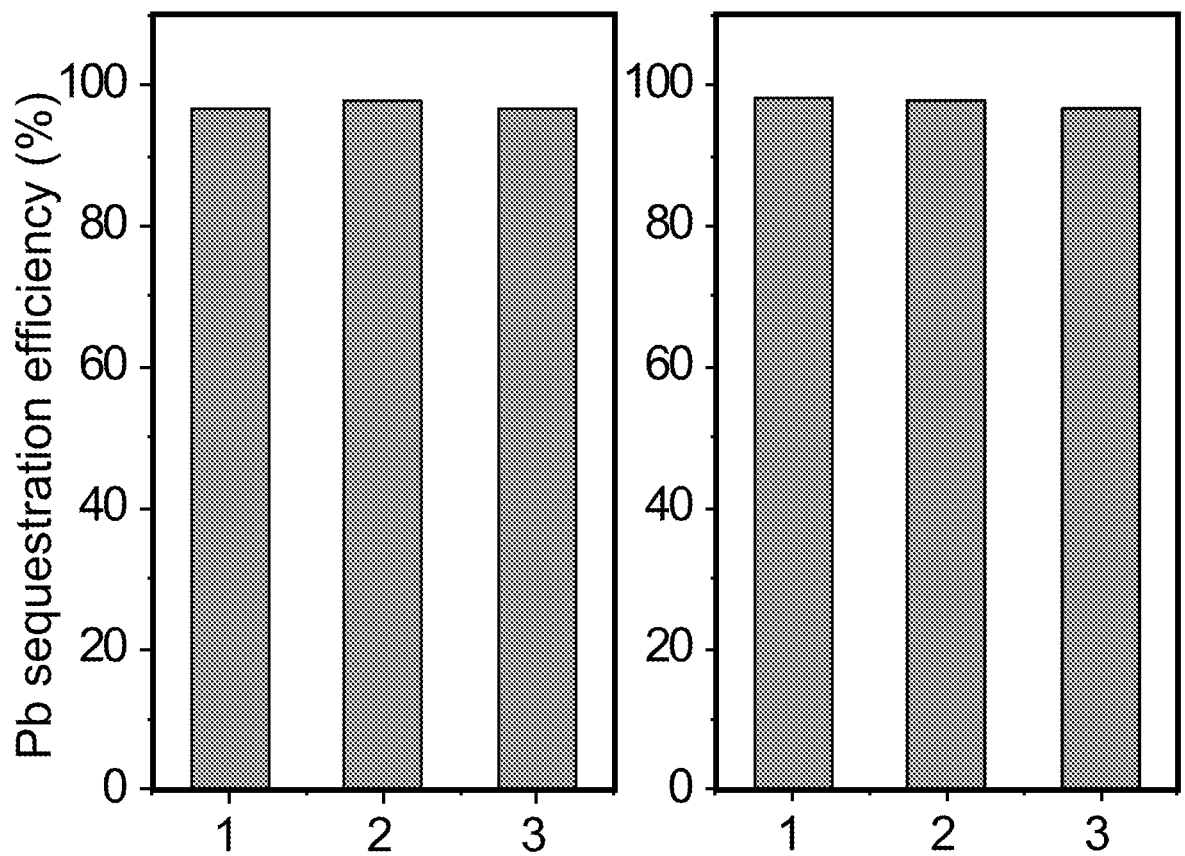
FIG. 16F illustrates a comparison of Pb-sequestration efficiency of devices at room temperature under flowing pure water (left) and acidic water at a pH of about 4.2 (right), according to some embodiments of the present disclosure.

FIG. 16F illustrates a comparison of Pb-sequestration efficiency of devices at room temperature under flowing pure water (left) and acidic water (right; pH=4.2), according to some embodiments of the present disclosure. Note that all devices were installed with Pb-sequestering layers on both sides, namely, DMDP on the glass side and EDTMP-PEO on the metal electrode side. The Pb-sequestration efficiency is specifically referred to these devices with both sides installed with Pb-sequestering layers. Three devices for each type of test conditions (pure water and acidic water) were measured (x-axis indicates sample numbers). The lead SQE was in the range of 96.6%-97.9% for pure water and in a similar range of 96.7%-98.1% for acidic water.

Methods:

Materials: All solvents, chemicals were used as received without further refinement except as otherwise noted and purchased from Sigma-Aldrich. P,P'-di(2-ethylhexyl)methanediphosphonic acid (DMDP) was purchased from Eichrom Technologies, Inc. $PbI_2$ and N,N,N',N'-Ethylenediaminetetrakis(methylenephosphonic Acid) (EDTMP) were from TCI Corporation. Spiro-OMeTAD was purchased from Merck Corporation. The titanium diisopropoxidebis(acetylacetonate), tert-butylpyridine, bis(trifluoromethanesulfonyl)imide lithium saltand, Poly(ethylene oxide) (PEO, Ave. Mv=~2000000), and Poly(vinyl alcohol) (PVA, Ave. M.W.=86000) were purchase from Sigma-Aldrich. The solar grade ethylene vinyl acetate (EVA) film was purchased from Amazon. The patterned FTO (fluorine-doped tin-oxide-coated) glass substrates (<15Ω/square) were obtained from Advanced Election Technology Company.

Device Fabrication: Devices were prepared on conductive FTO glass substrates. The substrates were further cleaned by the cleaner, isopropanol, acetone, and ethanol, during which the substrates were also rinsed by deionized water in between each step. A thickness of about 40 nm of compact titanium dioxide layer was deposited by spray pyrolysis of 7-mL isopropanol solution which contains 0.6-mL titanium diisopropoxide bis(acetylacetonate) solution (75% in isopropanol, Sigma-Aldrich) and 0.4-mL acetylacetone at 450° C. in air. Then, a layer of mesoporous titanium dioxide with the 30 nm-sized nanoparticles (30NRD, Dyesol) moderated in ethanol (1:6 w/w) was spin-coated at 4500 rpm for 15 seconds on this layer followed with heating at 500° C. for 0.5 hours in air. The precursors of $[(CsPbI_3)_{0.05}(FAPbI_3)_{0.85}(MAPbBr_3)_{0.15}]$ were dissolved in a mixed solvent of DMF/DMSO (4:1 v/v) and prepared in the glovebox to form a 1.4 M ($PbI_2$ and $PbBr_2$). For the perovskite film, a spin-coating procedure was executed at 2000 rpm for the first 10 seconds followed by 6000 rpm for the second 30 seconds. At 15 seconds before the end of the spin-coating procedure, 140 μL of chlorobenzene were dropped on the substrates. The substrates were then annealed on a hotplate at 100° C. for 1 hour with a petri dish covered. Subsequently, the spiro-OMeTAD solution, which was prepared by dissolving the spiro-OMeTAD in 1-mL chlorobenzene at a concentration of 60 mM with the addition of 30 mM bis(trifluoromethanesulfonyl)imide lithium salt from a stock solution in acetonitrile and 200 mM of tert-butylpyridine, as the hole-transporting material was deposited on top of the perovskite surface by spin coating at 4,000 rpm for 15 s. Finally, the devices were completed by thermal evaporation of 100-nm gold as the metal contact.

PSC packaging: All solar cells were treated in three conditions: 1) pristine devices packaged by EVA, 2) devices with DMDP on glass side packaged by EVA, and 3) devices with DMDP on glass side and EDTMP-PEO on metal side packaged by EVA. For the first case, the pristine devices were used as the control samples without any further processing. For the second case, the DMDP solution, dissolved in ethanol to form a solution at the concentration of 0.38 M, was spin-coated on the glass side of devices at 1000 rpm for 10 seconds. For the third case, the gold side was first wrapped by the EVA film with PEO-based Pb absorber layer inside. EVA film was softened to seal the edge of devices by heat treatment and the extra films on the edge were cut off to flush with the glass surface. The PEO-based Pb absorbing material was made from PEO films blended with EDTMP. After PEO dissolving in ACN at a concentration of 10 wt %, the PEO solution was physically mixed with additives of EDTMP and doctor bladed to form a PEO film, containing 0.01 g/$cm^2$ of EDTMP, on a plastic plate. Then, the PEO-based Pb absorbing material of the same area as the perovskite layer was cut off and sandwiched between the metal electrodes and EVA film. Thereafter, the wrapped device was spin-coated by DMDP on the glass side.

PSC characterizations: The simulated AM 1.5 G illumination with a power density of 100 mW/$cm^2$ (Oriel Sol3A Class AAA Solar Simulator) was used to measure the solar cell performance. The current density-voltage (J-V) characteristic curves were tested using Keithley 2400 source meter. The J-V characteristic curves of all solar cells were measured by employing a metal mask with an activate area of 0.12 $cm^2$. Scan curves of both backward and forward were tested with a bias step fixing at 10 mV and delay time fixing at 0.05 seconds. The potentiostat (Princeton Applied Research, Versa STAT MC) was employed to measure the continuous current and power output. Incident photon-to-electron conversion efficiency (IPCE) spectra of solar cells were measured using a solar cell quantum-efficiency measurement system (QEX10, PV Measurements).

Pb absorption characterizations: The optical transmission spectroscopy was carried out with UV-VIS spectrophotometer (UV-2600, Shimadzu Scientific Instruments, Inc.) at a spectral range of 300 to 1100 nm. The prepared DMDP solutions with the concentration of 0.19 M, 0.38 M, 0.57 M, and 0.76 M to attain different thicknesses, respectively were spin-coated on the glass substrates (VWR International, LLC.) at 1000 rpm for 10 seconds for subsequent transmittance measurements. The thickness was determined by mass based on the density of DMDP (1.05 g/mL).

Atomic Absorption Flame Emission Spectrophotometer (FAAS) was conducted with an AA-6200 (Shimadzu Scientific Instruments, Inc.), equipped with a Pb hollow cathode lamp as a radiation source where the resonance line wavelength is 217 nm. Air/acetylene flame with a fuel rate of 2 L/min, lamp current of 12 mA with a slit width of 0.7 nm under mode of BGC-D2 were applied. A calibration curve made by $PbI_2$ aqueous solutions for determination of the Pb content in deionized water as a standard was referenced by all sample tests. All samples were delivered to the instrument by clean syringes with a filter to avoid solids debris that can affect the flame per manufacturer's instruction. For preliminary evaluation of the absorption capacity of DMDP, the size of 2×2 $cm^2$ glass substrates were spin-coated with DMDP solutions first. For each concentration, gradient spin rates, ranging from 500 to 4000rpm, were employed to form the transparent layers with different thicknesses. Then, each DMDP-coated glass substrate was dipped into 50 mL 4 ppm aqueous $PbI_2$ solutions for time-dependent Pb-absorption measurements. Similarly, for preliminary evaluation of Pb-absorbing films used on the metal electrode side, each film with a size of 2×2 $cm^2$ was soaked into 50 mL 7 ppm aqueous $PbI_2$ solutions for time-dependent Pb-absorption measurements. The Pb amount in the DMDP film is determined by dissolving the films in ethanol.

FIRST EXAMPLE SET

Example 1. A composition comprising: a sequestering material capable of binding a target material, wherein: the sequestering material comprises a first component comprising at least one of a functional group, a molecule, an oligomer, or a polymer, and the target material comprises at least one of an element, a chemical, or a compound.

Example 2. The composition of Example 1, wherein the binding comprises at least one of chelation, reacting, ionically interacting, or physically adsorbing.

Example 3. The composition of Example 1, wherein the element comprises at least one element from at least one of Rows 4, 5, 6, and 7 of the Periodic Table or an inner transition metal.

Example 4. The composition of Example 1, wherein the element comprises at least one of cadmium, lead, tin, germanium, bismuth, thallium, chromium, mercury, antimony, or arsenic.

Example 5. The composition of Example 1, wherein the target material comprises at least one of lead, tin, germanium, cadmium, copper, indium, gallium, mercury, bismuth, chromium, iron, copper, zinc, aluminum beryllium, ruthenium, nickel, cobalt, manganese, silver, thallium, indium, antimony, germanium, selenium, tellurium, or arsenic.

Example 6. The composition of Example 1, wherein the target material comprises at least one of lead, tin, germanium, cadmium, copper, indium, gallium, mercury, bismuth, chromium, iron, copper, zinc, aluminum beryllium, ruthenium, nickel, cobalt, manganese, silver, thallium, indium, antimony, germanium, selenium, tellurium, arsenic, iodine, bromine, chlorine, or fluorine.

Example 7. The composition of Example 1, wherein the target material is in any valence state.

Example 8. The composition of Example 7, wherein the target material comprises lead.

Example 9. The composition of Example 8, wherein the target material comprises $Pb^{2+}$.

Example 10. The composition of Example 1, wherein a chemical comprises at least one of sulfate, acetate, chromate, dichromate, nitrate, permanganate, carbonate, citrate, cyanide, or phosphate.

Example 11. The composition of Example 1, wherein the first component comprises at least one of hydrogen, phosphorus, nitrogen, sulfur, oxygen, carbon, or silicon.

Example 12. The composition of Example 11, wherein the first component comprises at least one of an amine group, an amide group, a hydrazine group, an isocyanate group, a nitrile group, a nitrite group, an amino group, an imino group, an imido group, a hydrazine group, a cyanate group, an isocyano group, an isocyanato-nitrooxy group, a cyano group, a nitrosooxy group, a nitroso group, a pyridyl group, or a carboxamido group.

Example 13. The composition of Example 11, wherein the first component comprises at least one of a thiol group, a sulfide group, a disulfide group, a sulfoxide group, a sulfone group, a sulfinic acid group, a sulfonic acid group, a thiocyanato group, a mercapto group, a sulfanyl group, a sulfinyl group, a sulfo group, a sulfonyl group, an isothiocyanato group or a disulfide group.

Example 14. The composition of Example 11, wherein the first component comprises at least one of a hydroxyl group, a carbonyl group, a carboxylate group.

Example 15. The composition of Example 11, wherein the first component comprises at least one of a silicate group, a siliconate group, a silane group, or a siloxane.

Example 16. The composition of Example 11, wherein the first component comprises at least one of a phosphonic group, a phosphate group, a phosphoryl group, a phosphono group, a phosphor group, or a phosphoryl group.

Example 17. The composition of Example 16, wherein: the first component has a structure defined by

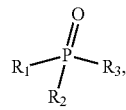

and each of $R_1$, $R_2$, and $R_3$ comprise at least one of hydrogen, oxygen, or carbon.

Example 18. The composition of Example 17, wherein: the structure is defined by

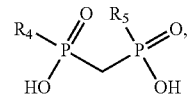

and both $R_4$ and $R_5$ comprise at least one of hydrogen, oxygen, or carbon.

Example 19. The composition of Example 18, wherein: the structure is defined by

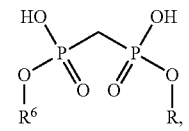

and both $R^6$ and R comprise at least one of hydrogen, oxygen, or carbon.

Example 20. The composition of Example 19, wherein: the structure is defined by

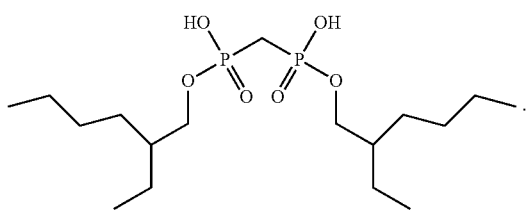 [SMILES: CCCCC(CC)COP(=O)(O)CP(=O)(O)OCC(CC)CCCC]

Example 21. The composition of Example 1, wherein the first component comprises at least one of P,P'-di(2-ethylhexyl)methanediphosphonic acid (DMDP) or N,N,N',N'-ethylenediaminetetrakis(methylenephosphonic acid) (EDTMP).

Example 22. The composition of Example 1, wherein the first component comprises at least one of DMDP, EDTMP, dimercaptosuccinic acid (DMSA), ethylenediaminetetraacetic acid (EDTA), nitrilotriacetic acid (NTA), ethylenediaminedisuccinic acid (EDDS), iminodisuccinic acid (IDS), methylglycine diacetic acid (MGDA), L-Glutamic acid N,Ndiacetic acid (GLDA), 2-hydroxyethyliminodiacetic acid (HEIDA), ethylenediamine-N,N'-dimalonic acid (EDDM), ethylenediamine-N,N'-diglutaric acid (EDDG), 3-hydroxy-2,2-iminodisuccinic acid (HIDS), and/or 2,6-pyridine dicarboxylic acid (PDA), poly ethylene glycol (PEG), poly vinyl alcohol, poly vinyl pyrrolidone, or a cellulose-based material.

Example 23. The composition of Example 1, wherein the first component comprises at least one of poly(vinyl alcohol) (PVA), poly(ethylene oxide) (PEO), a polyacrylate, a derivative of a polyacrylate, polyvinylpyrrolidone, an oxide, a glass, or a silicone gel.

Example 24. The composition of Example 1, wherein the sequestering material has first a capacity to bind the target material at a first ratio between about 0.001 grams of the target material per gram of the sequestering material and about 100 grams of the target material per gram of the sequestering material.

Example 25. The composition of Example 24, wherein the first ratio is between about 0.01 and 10.

Example 26. The composition of Example 1, wherein the sequestering material is substantially transparent to light having a wavelength between about 300 nm and about 1200 nm.

Example 27. The composition of Example 1, wherein the sequestering material has a solubility product constant value, $K_{sp}$, for the target material between about $10^{-60}$ and about 1.

Example 28. The composition of Example 1, wherein the sequestering material has second a capacity absorb water at a second ratio between about 0.01 grams of water per gram of the sequestering material and about 100 grams of water per gram of the sequestering material.

Example 29. The composition of Example 1, wherein the sequestering material has second a capacity absorb water at a second ratio between about 0.1 grams of water per gram of the sequestering material and about 100 grams of water per gram of the sequestering material.

Example 30. The composition of Example 1, wherein the sequestering material further comprises a matrix material.

Example 31. The composition of Example 30, wherein the sequestering material and the matrix material are at least one of covalently bonded or ionically bonded to each other.

Example 32. The composition of Example 30, wherein the matrix material comprises at least one of a polymer or an oligomer.

Example 33. The composition of Example 30, wherein the matrix material comprises at least one of PVA, PEO, a polyacrylate, a derivative of a polyacrylate, polyvinylpyrrolidone, an oxide, a glass, or a silicone gel.

Example 34. The composition of Example 30, wherein the first component and the matrix material are present at a second ratio between about 0.001 grams of the first component per gram of the matrix material and about 100 grams of the first component per gram of the matrix material.

Example 35. The composition of Example 34, wherein the first component and the matrix material are present at a second ratio between about 0.01 grams of the first component per gram of the matrix material and about 10 grams of the first component per gram of the matrix material.

Example 36. The composition of Example 30, wherein the sequestering material is substantially transparent to light having a wavelength between about 300 nm and about 1200 nm.

Example 37. The composition of Example 30, wherein the sequestering material has a solubility product constant value, $K_{sp}$, for the target material between about $10^{-60}$ and about 1.

Example 38. The composition of Example 30, wherein the sequestering material has second a capacity to absorb water at a second ratio between about 0.01 grams of water per gram of the sequestering material and about 100 grams of water per gram of the sequestering material.

Example 39. The composition of Example 38, wherein the sequestering material has second a capacity absorb water at a second ratio between about 0.1 grams of water per gram of the sequestering material and about 100 grams of water per gram of the sequestering material.

Example 40. The composition of Example 1, wherein: the sequestering material is present in a continuous phase, and the target material is present in a phase dispersed within the continuous phase.

Example 41. The composition of Example 1, wherein: the target material is present in a continuous phase, and the sequestering material is present in a phase dispersed within the continuous phase.

Example 42. The composition of either Example 40 or 41, wherein the composition is used as at least one of a coating or a paint.

SECOND EXAMPLE SET

Example 1. A device comprising: a first feature comprising a sequestering material; and a second feature comprising a target material, wherein: the sequestering material is capable of binding the target material, the sequestering material comprises a first component comprising at least one of a functional group, a molecule, an oligomer, or a polymer, and the target material comprises at least one of an element, a chemical, or a compound.

Example 2. The device of Example 1, wherein the device comprises at least one of a photovoltaic device, an electronic device, an optoelectronic device, or a building structure.

Example 3. The device of Example 1, wherein the photovoltaic device comprises at least one of a feature of a solar cell, a solar cell, a solar panel, a solar module, or a solar array.

Example 4. The device of Example 2, wherein the device comprises at least one of a sensor, a light-emitting diodes, a solar window, a sensor, a display, or a memristor.

Example 5. The device of Example 1, wherein at least one of the first feature or the second feature has a three-dimensional shape comprising at least one of an amorphous particle, a planar structure, a sphere, a cylinder, a cuboid, a cone, a pyramid, or a polyhedron.

Example 6. The device of Example 1, wherein: the first feature comprises a coating containing the sequestering material, the second feature comprises a building structure containing the target material, and the building structure comprises a surface substantially covered by the coating.

Example 7. The device of Example 6, wherein the building structure comprises at least one of a wall, a ceiling, a floor, or a pipe.

Example 8. The device of Example 3, wherein: the first feature comprises a first planar structure, the second feature comprises a second planar structure, and the first planar structure and the second planar structure are adjacent and substantially parallel to one another.

Example 9. The device of Example 8, wherein the second planar structure comprises at least one of an active material or a charge-transport material.

Example 10. The device of Example 9, wherein the active material comprises a semiconductor.

Example 11. The device of Example 10, wherein the semiconductor is photovoltaic.

Example 12. The device of Example 11, wherein the active material comprises at least one of a perovskite, a polymer, a III-V alloy, cadmium, tellurium, copper, indium, gallium, selenium, or silicon.

Example 13. The device of Example 12, wherein the perovskite comprises at least one of a zero-dimensional perovskite, a one-dimensional perovskite, a two-dimensional perovskite, or a three-dimensional perovskite.

Example 14. The device of Example 13, wherein the perovskite comprises at least three of a first cation (A), a second cation (B), and an anion (X).

Example 15. The device of Example 14, wherein the perovskite has a structure comprising $ABX_3$.

Example 16. The device of Example 14, wherein A comprises at least one of an alkylammonium, formamidinium, cesium, hydrazinium, acetylammonium, imidazolium, or guanidinium.

Example 17. The device of Example 16, wherein the alkylammonium comprises at least one of dimethylammonium, methylammonium, ethylammonium, or butylammonium.

Example 18. The device of Example 14, wherein B comprises at least one of lead, tin, or germanium.

Example 19. The device of Example 14, wherein X comprises a halogen.

Example 20. The device of Example 13, further comprising a third cation (M), wherein M comprises at least one of butylammonium, phenylethylammonium, cyclopropylammonium, polyethylenimine, iodoethylammonium, ethane-1,2-diammonium, or ammoniumvaleric acid.

THIRD EXAMPLE SET

Example 1. A method for sequestering a target material, the method comprising: applying a composition comprising a sequestering material to a device having a feature comprising the target material, wherein: over a period of time, a portion of the target material is removed from the feature due to exposure to the environment, and the sequestering material binds the portion of the target material, preventing its leakage into the environment.

Example 2. The method of Example 1, further comprising, at the conclusion of the period of time, recovering the target material from the sequestering material.

Example 3. The method of Example 1, wherein the period of time is between one month and 100 years.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A photovoltaic device comprising:
    a perovskite layer comprising at least one of lead, tin, or bismuth; and
    a sequestering material layer capable of binding at least one of lead, tin, or bismuth, wherein:
    the sequestering material layer comprises a first component comprising at least one of a phosphonic group, a phosphate group, a phosphono group, a phosphor group, a phosphoryl group, a hydroxyl group, or a carboxylic acid group.

2. The photovoltaic device of claim 1, wherein the lead is in a form comprising $Pb^{2+}$.

3. The photovoltaic device of claim 1, wherein the first component further comprises at least one of hydrogen, nitrogen, sulfur, carbon, or silicon.

4. The photovoltaic device of claim 1, wherein:
    the first component is defined by a structure comprising

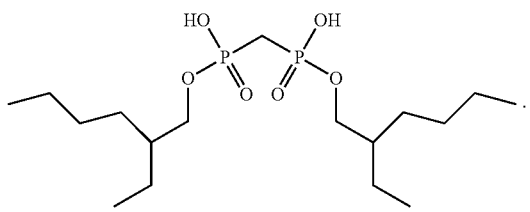 [SMILES: CCCCC(CC)COP(=O)(O)CP(=O)(O)OCC(CC)CCCC]

5. The photovoltaic device of claim 1, wherein the first component comprises at least one of P,P'-di(2-ethylhexyl) methanediphosphonic acid, N,N,N', N'-ethylenediaminetetrakis(methylenephosphonic acid), dimercaptosuccinic acid, ethylenediaminetetraacetic acid, nitrilotriacetic acid, ethylenediaminedisuccinic acid, iminodisuccinic acid, methylglycine diacetic acid, L-Glutamic acid N,Ndiacetic acid, 2-hydroxyethyliminodiacetic acid, ethylenediamine-N,N'-dimalonic acid, ethylenediamine-N,N'-diglutaric acid, 3-hydroxy-2,2-iminodisuccinic acid, 2,6-pyridine dicarboxylic acid, polyethylene glycol, polyvinyl alcohol, or a cellulose-based material.

6. The photovoltaic device of claim 1, wherein the sequestering material layer further comprises a matrix material.

7. The photovoltaic device of claim 6, wherein the matrix material comprises at least one of a polymer or an oligomer.

8. The photovoltaic device of claim 6, wherein the matrix material comprises at least one of a poly(vinyl alcohol), a poly(ethylene oxide), a polyacrylate, a derivative of a polycrylate, a polyvinylpyrrolidone, an oxide, a glass, or a silicone gel.

9. The photovoltaic device of claim 6, wherein the first component and the matrix material are present at a first ratio between about 0.001 grams of the first component per gram of the matrix material and about 100 grams of the first component per gram of the matrix material.

10. The photovoltaic device of claim 6, wherein the sequestering material layer is substantially transparent to light having a wavelength between about 300 nm and about 1200 nm.

11. The photovoltaic device of claim 6, wherein the sequestering material layer has a solubility product constant value, $K_{sp}$, for at least one of lead, tin, or bismuth between about $10^{-60}$ and about 1.

12. The photovoltaic device of claim 6, wherein the sequestering material layer has a capacity to absorb water at a second ratio between about 0.01 grams of water per gram of the sequestering material layer and about 100 grams of water per gram of the sequestering material layer.

* * * * *